United States Patent
Chiang et al.

(10) Patent No.: US 12,021,123 B2
(45) Date of Patent: *Jun. 25, 2024

(54) SEMICONDUCTOR DEVICES WITH BACKSIDE POWER RAIL AND BACKSIDE SELF-ALIGNED VIA

(71) Applicant: Taiwan Semiconductor Manufacturing Co., Ltd., Hsinchu (TW)

(72) Inventors: Kuo-Cheng Chiang, Hsinchu County (TW); Shi Ning Ju, Hsinchu (TW); Kuan-Lun Cheng, Hsin-Chu (TW); Chih-Hao Wang, Hsinchu County (TW); Cheng-Chi Chuang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 85 days.

This patent is subject to a terminal disclaimer.

(21) Appl. No.: 17/833,145

(22) Filed: Jun. 6, 2022

(65) Prior Publication Data
US 2022/0302268 A1   Sep. 22, 2022

Related U.S. Application Data

(63) Continuation of application No. 17/080,521, filed on Oct. 26, 2020, now Pat. No. 11,355,601.
(Continued)

(51) Int. Cl.
*H01L 29/417* (2006.01)
*H01L 23/522* (2006.01)
(Continued)

(52) U.S. Cl.
CPC .... *H01L 29/41733* (2013.01); *H01L 23/5226* (2013.01); *H01L 23/5286* (2013.01);
(Continued)

(58) Field of Classification Search
CPC .......... H01L 29/41733; H01L 23/5226; H01L 23/5286; H01L 29/0653; H01L 29/401;
(Continued)

(56) References Cited

U.S. PATENT DOCUMENTS 11,355,601 B2 *   6/2022   Chiang ............. H01L 29/66553
2018/0219075 A1   8/2018   Morrow et al.
(Continued)

FOREIGN PATENT DOCUMENTS

JP    2010171166 A    8/2010
KR    20190015269 A   2/2019
(Continued)

*Primary Examiner* — Tong-Ho Kim
(74) *Attorney, Agent, or Firm* — Haynes and Boone, LLP

(57) ABSTRACT

A semiconductor structure includes a source/drain; one or more channel layers connected to the source/drain; a gate structure adjacent the source/drain and engaging each of the one or more channel layers; a first silicide layer over the source/drain; a source/drain contact over the first silicide layer; a power rail under the source/drain; one or more first dielectric layers between the source/drain and the power rail; and one or more second dielectric layers under the first silicide layer and on sidewalls of the source/drain, wherein the one or more second dielectric layers enclose an air gap.

20 Claims, 24 Drawing Sheets

Related U.S. Application Data

(60) Provisional application No. 63/002,776, filed on Mar. 31, 2020.

(51) Int. Cl.
*H01L 23/528* (2006.01)
*H01L 29/06* (2006.01)
*H01L 29/40* (2006.01)
*H01L 29/423* (2006.01)
*H01L 29/66* (2006.01)
*H01L 29/786* (2006.01)

(52) U.S. Cl.
CPC ........ *H01L 29/0653* (2013.01); *H01L 29/401* (2013.01); *H01L 29/42392* (2013.01); *H01L 29/66553* (2013.01); *H01L 29/6681* (2013.01); *H01L 29/78696* (2013.01)

(58) Field of Classification Search
CPC ......... H01L 29/42392; H01L 29/66553; H01L 29/6681; H01L 29/78696; H01L 21/28518; H01L 21/76897; H01L 29/1079; H01L 29/4175; H01L 29/0673; H01L 29/66439; H01L 29/165; H01L 29/66545; H01L 29/775; H01L 29/7848; H01L 29/665; H01L 21/823475; B82Y 10/00
USPC ........................................................ 257/288
See application file for complete search history.

(56) References Cited

U.S. PATENT DOCUMENTS

| | | |
|---|---|---|
| 2019/0157310 A1 | 5/2019 | Glass et al. |
| 2019/0157406 A1 | 5/2019 | Hwang et al. |
| 2019/0164882 A1 | 5/2019 | Chen et al. |
| 2019/0259699 A1 | 8/2019 | Morrow et al. |
| 2019/0386112 A1 | 12/2019 | Lu et al. |
| 2020/0044023 A1 | 2/2020 | Renicek |
| 2020/0126798 A1* | 4/2020 | Lin ................. B82Y 10/00 |
| 2020/0135646 A1 | 4/2020 | Rubin |
| 2021/0098294 A1 | 4/2021 | Smith |
| 2021/0375691 A1 | 12/2021 | Chen et al. |
| 2021/0391325 A1 | 12/2021 | Su et al. |
| 2022/0013453 A1 | 1/2022 | Chen et al. |

FOREIGN PATENT DOCUMENTS

| | | |
|---|---|---|
| KR | 20190056886 A | 5/2019 |
| WO | 2018004653 A1 | 1/2018 |

\* cited by examiner

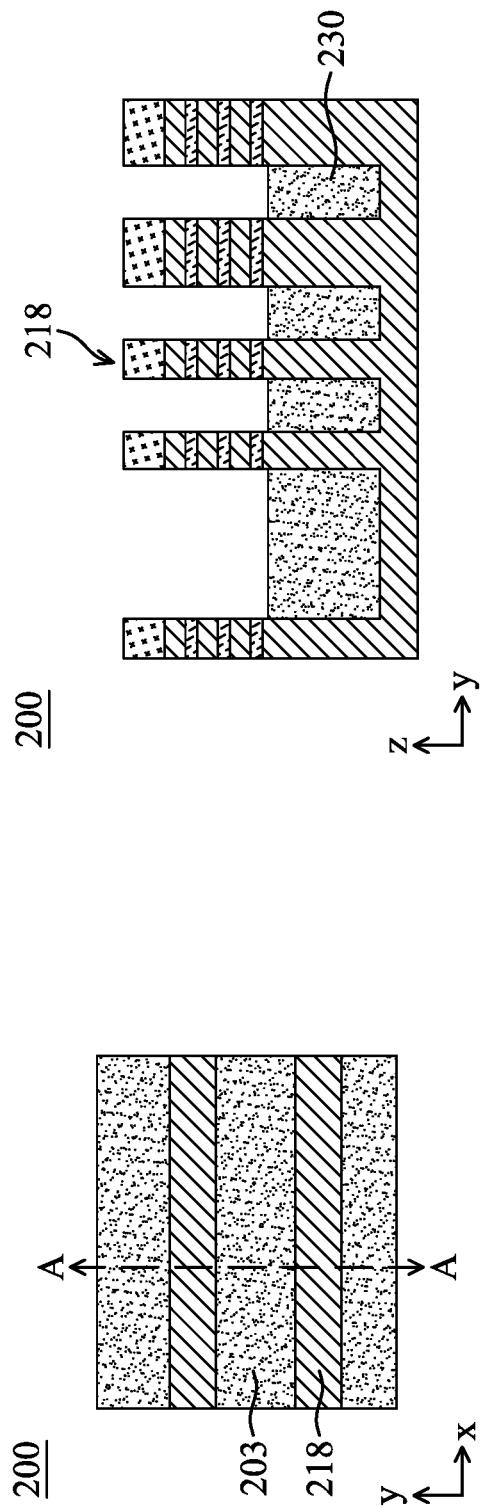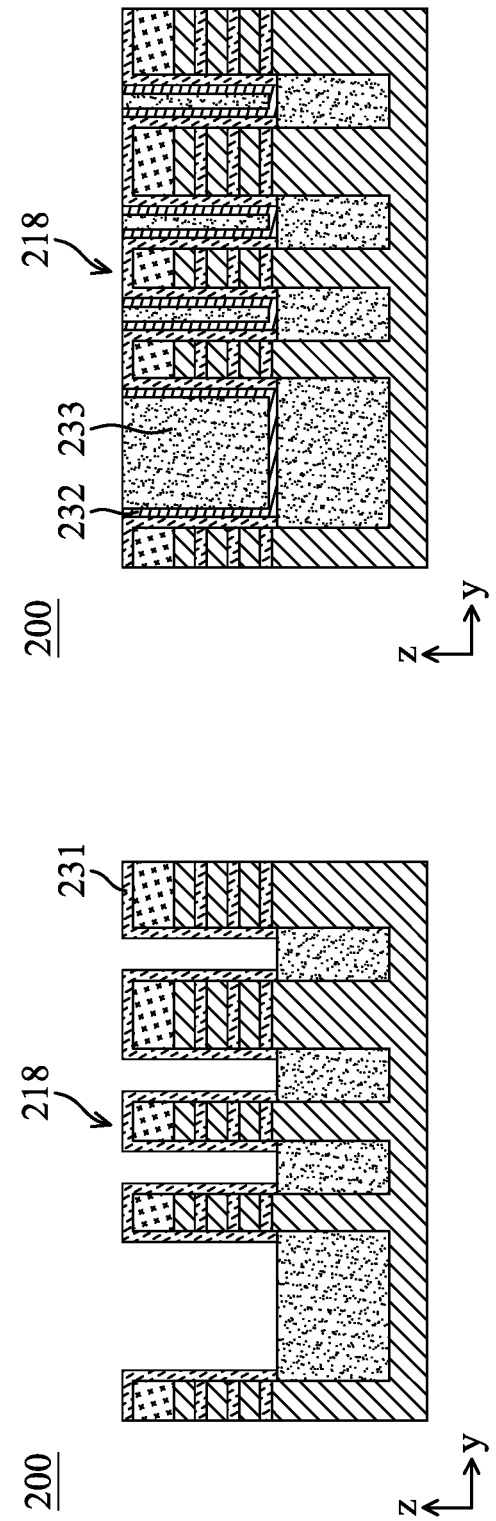

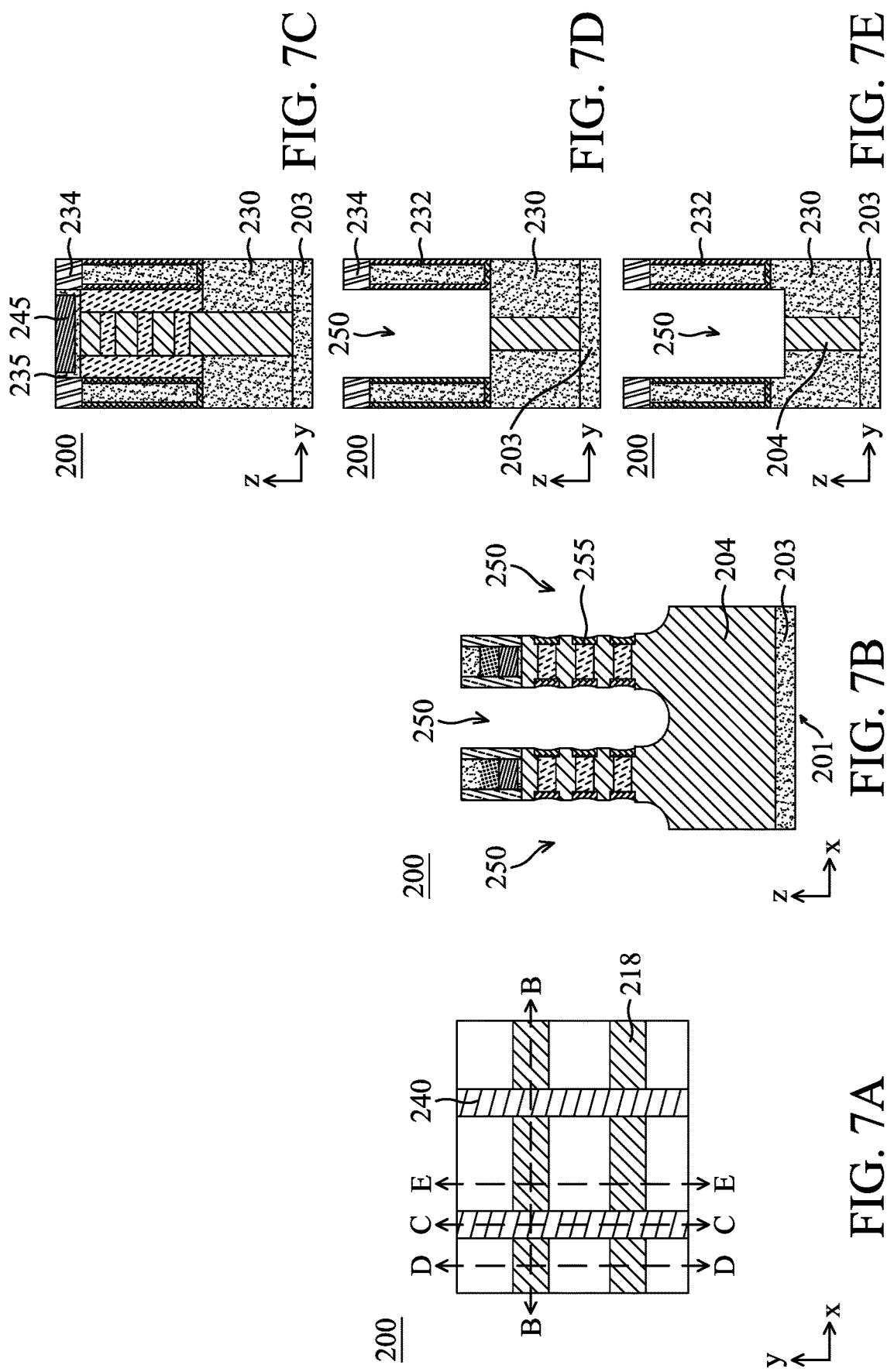

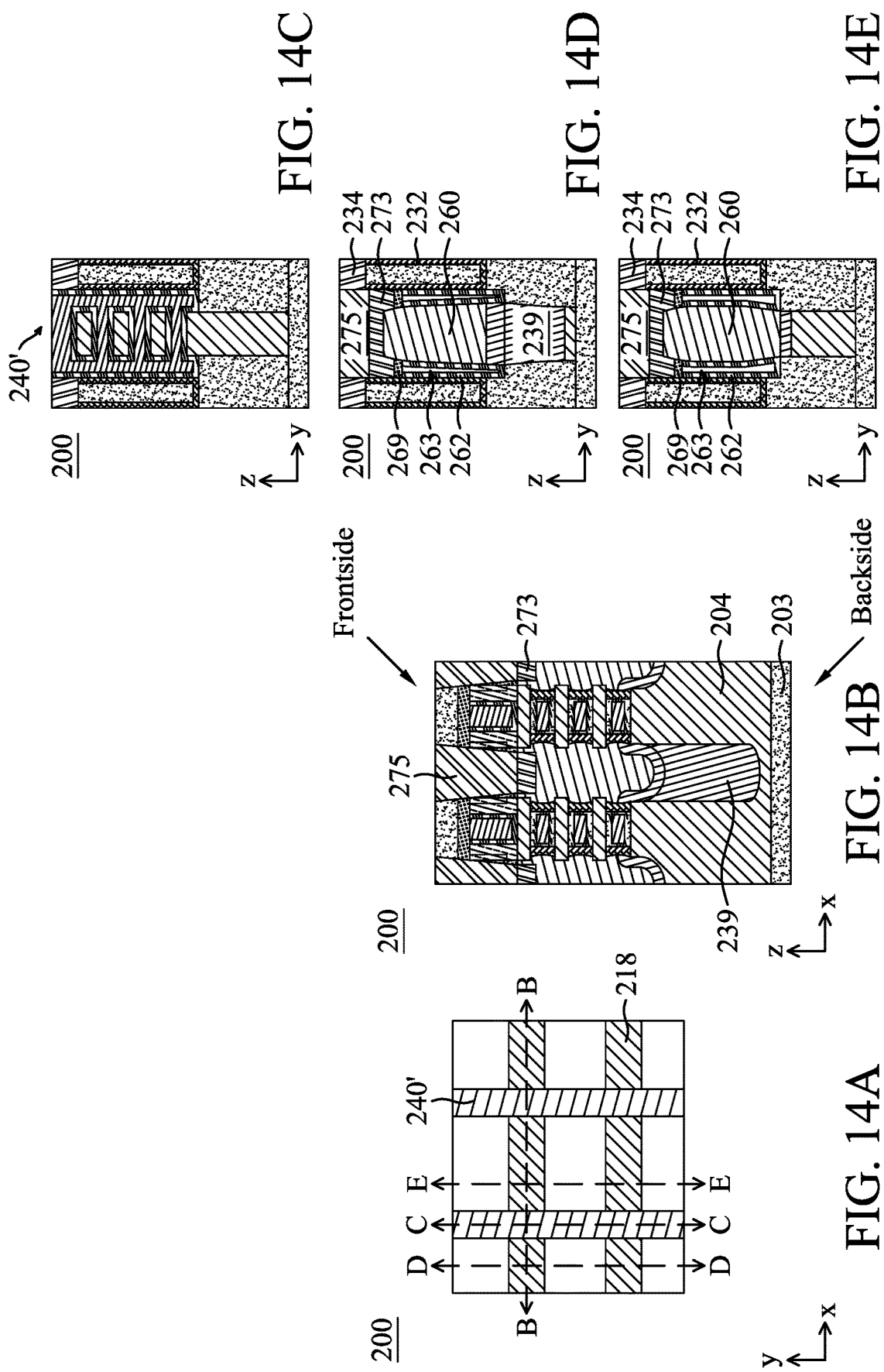

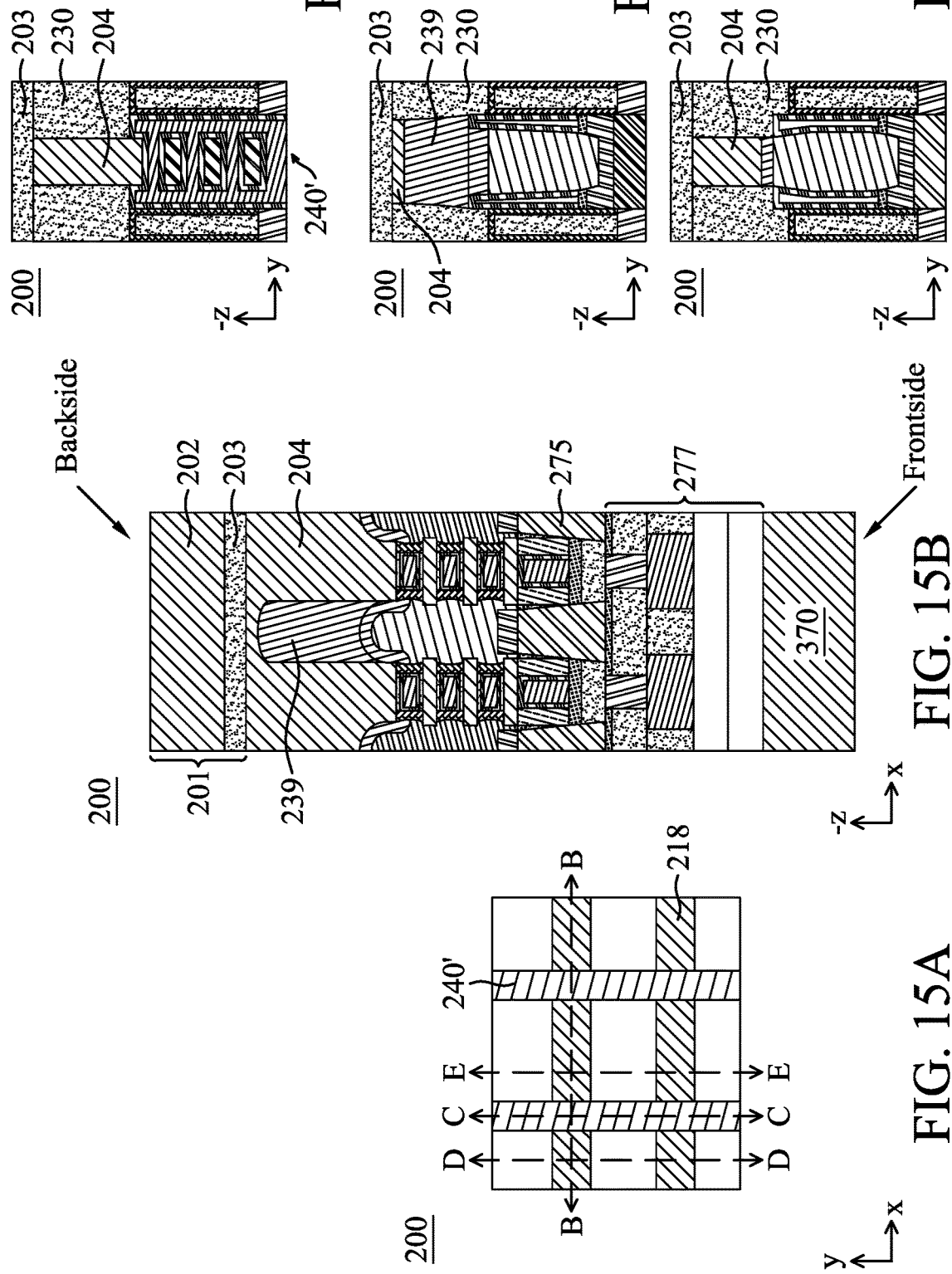

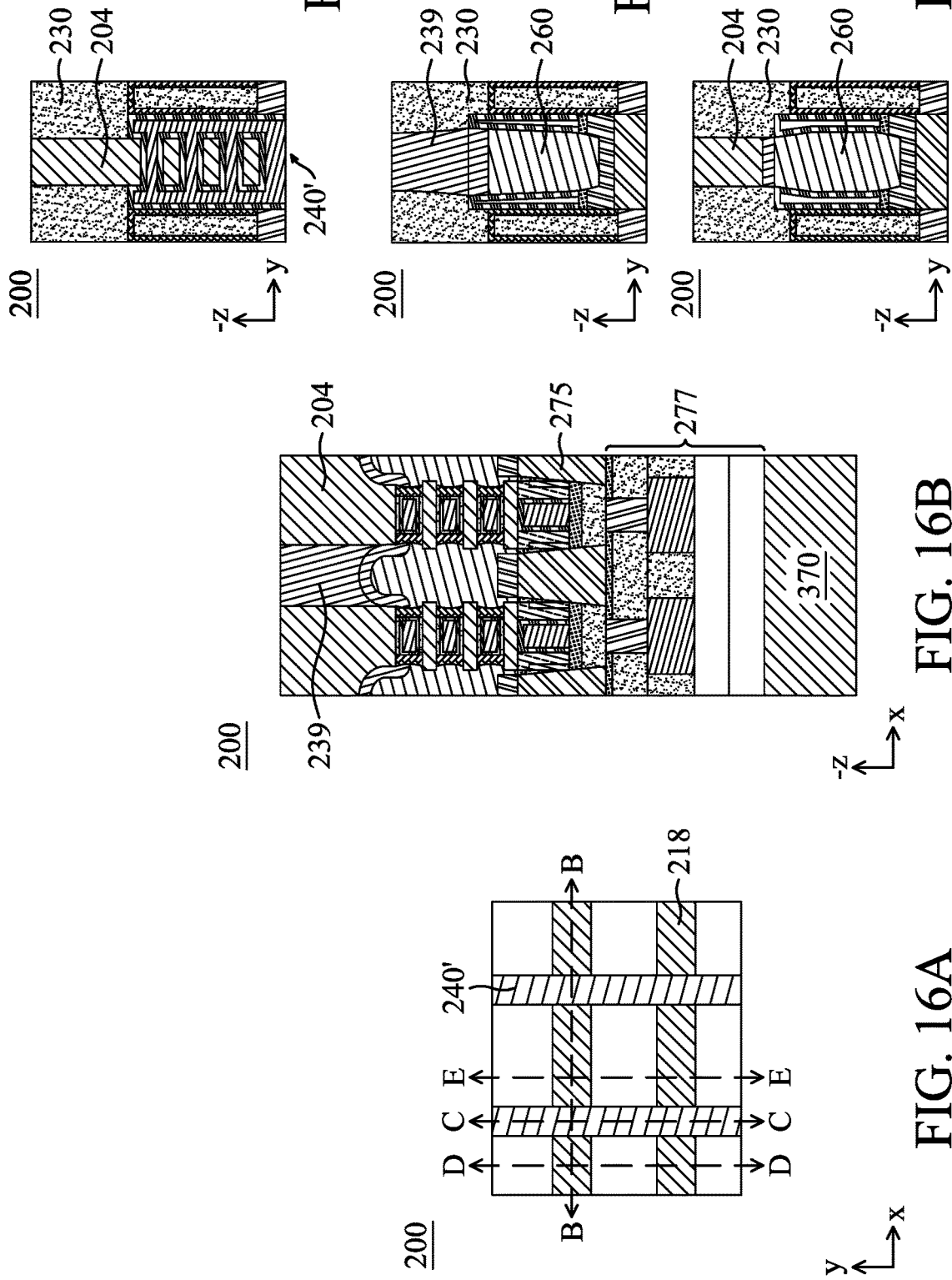

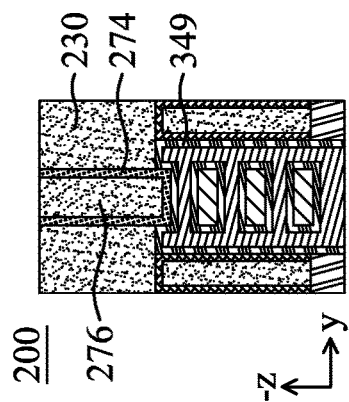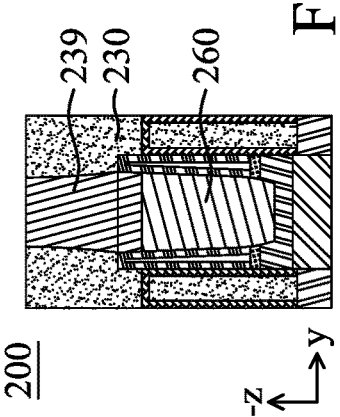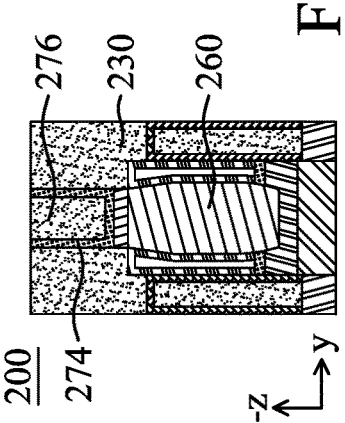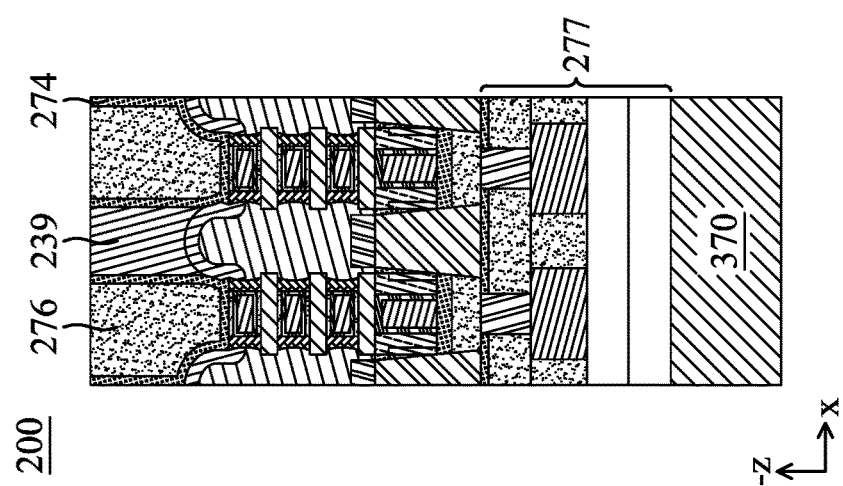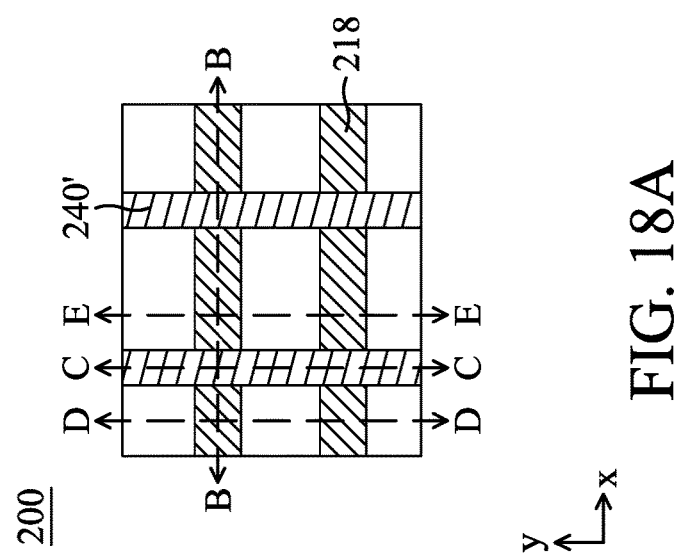

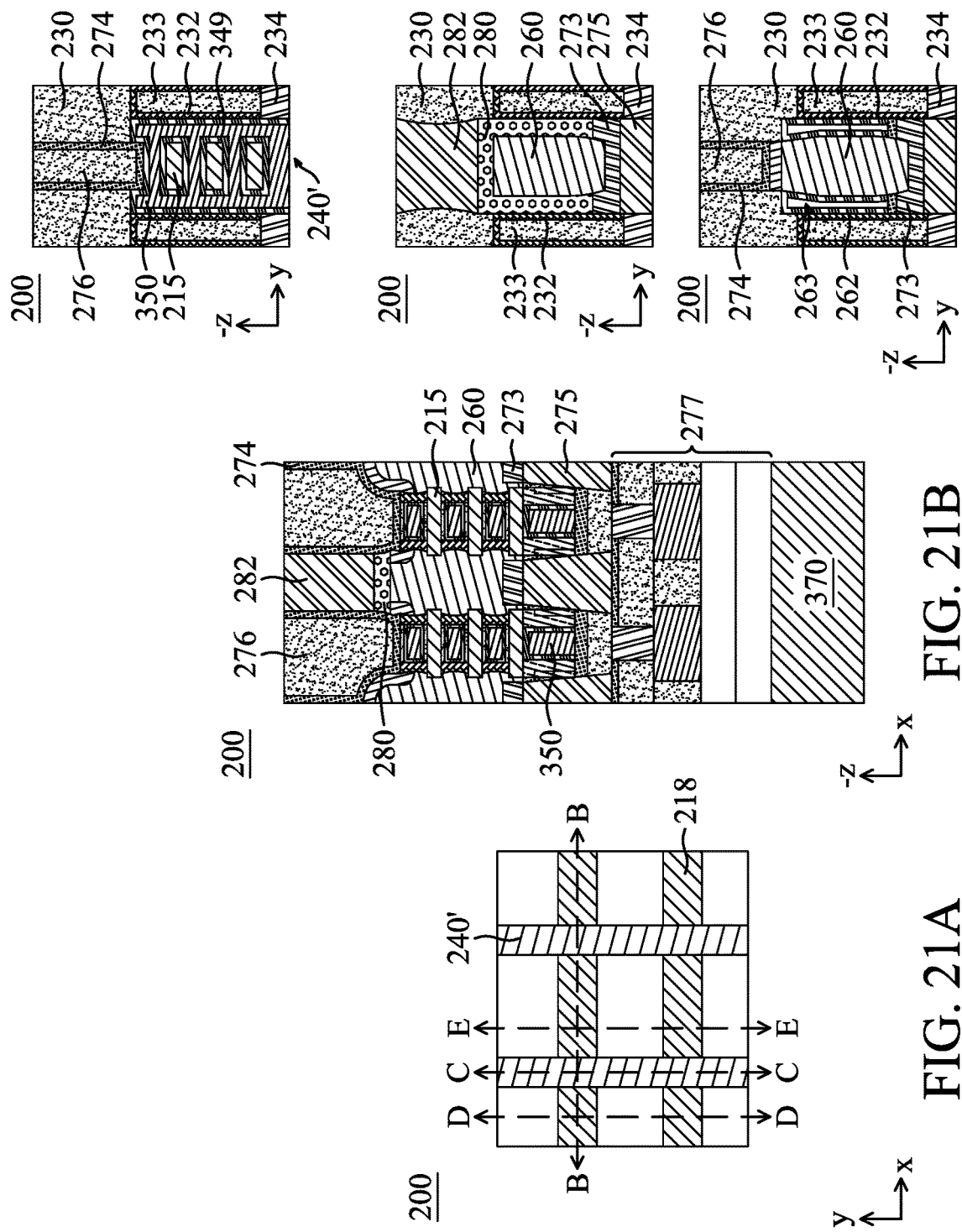

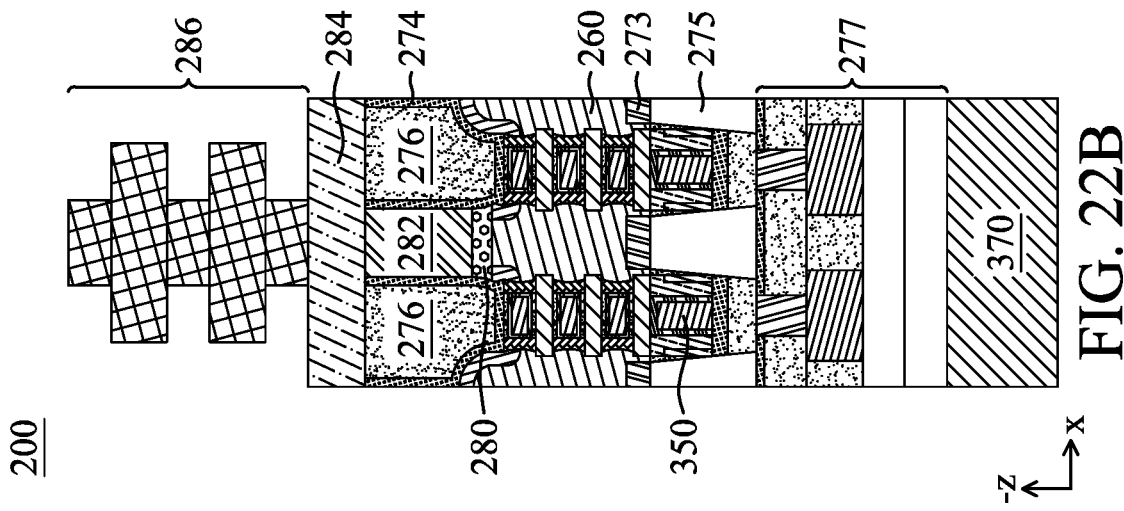
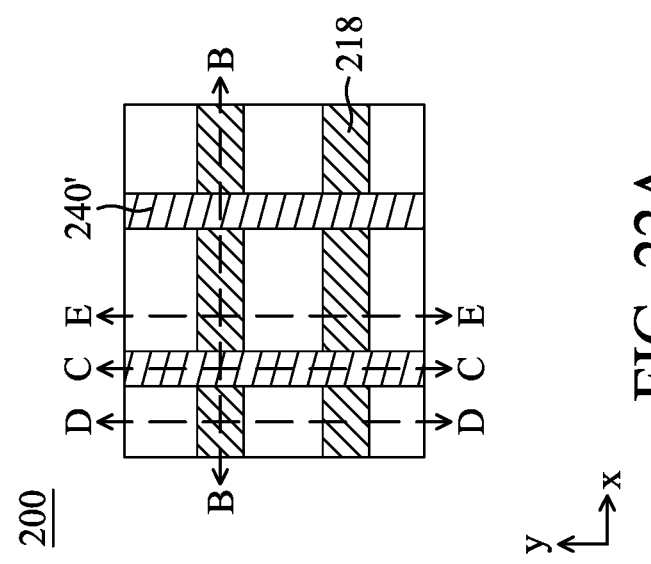
FIG. 22B
FIG. 22A

SEMICONDUCTOR DEVICES WITH BACKSIDE POWER RAIL AND BACKSIDE SELF-ALIGNED VIA

PRIORITY

This is a continuation of U.S. application Ser. No. 17/080,521, filed Oct. 26, 2020, which claims benefits to U.S. Provisional Application Ser. No. 63/002,776 filed Mar. 31, 2020, the entire disclosure of which is incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 5A, 6A, 7A, 8A, 9A, 10A, 11A, 12A, 13A, 14A, 15A, 16A, 17A, 18A, 19A, 20A, 21A, and 22A illustrate top views of a portion of a semiconductor device, according to some embodiments.

FIGS. 4B, 5B, 5C, 5D, 5E, 5F, 5G, 6B, 7B, 7C, 7D, 7E, 8B, 8C, 8D, 8E, 9B, 9C, 9D, 9E, 10B, 10C, 10D, 10E, 11B, 11C, 11D, 11E, 12B, 12C, 12D, 12E, 13B, 13C, 13D, 13E, 14B, 14C, 14D, 14E, 15B, 15C, 15D, 15E, 16B, 16C, 16D, 16E, 17B, 17C, 17D, 17E, 18B, 18C, 18D, 18E, 19B, 19C, 19D, 19E, 20B, 20C, 20D, 20E, 21B, 21C, 21D, 21E, and 22B illustrate cross-sectional views of a portion of a semiconductor device, according to some embodiments.

DETAILED DESCRIPTION

Figure 1A:
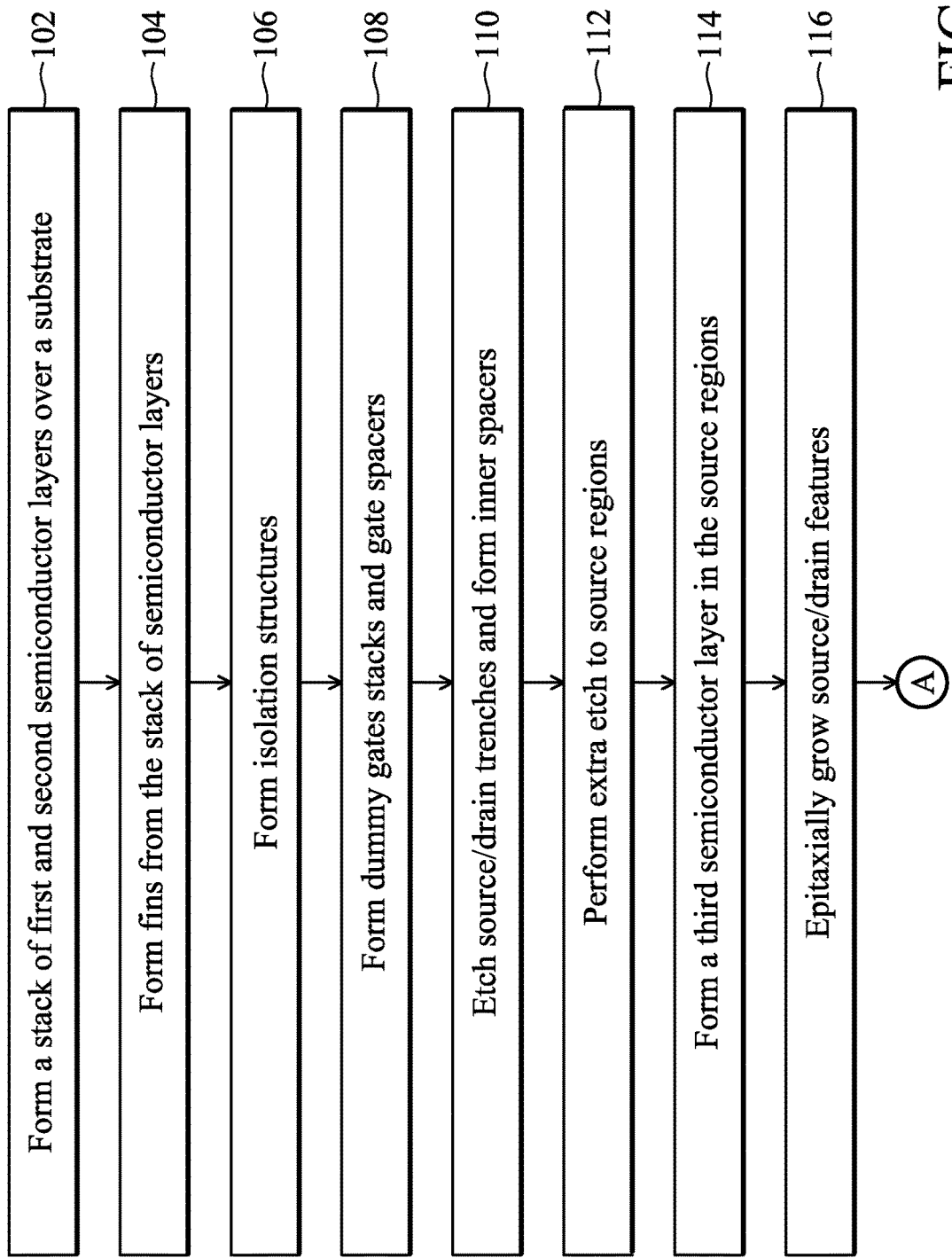
FIGS. 1A, 1B, and 1C show a flow chart of a method of forming a semiconductor device with backside power rails and backside self-aligned vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside self-aligned vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides structures and methods for isolating the backside power rails from nearby conductors such as metal gates and provides structures and methods for reducing resistance between the backside power rails and source/drain (S/D) features. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside power rail and backside self-aligned vias. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

Figure 1B:
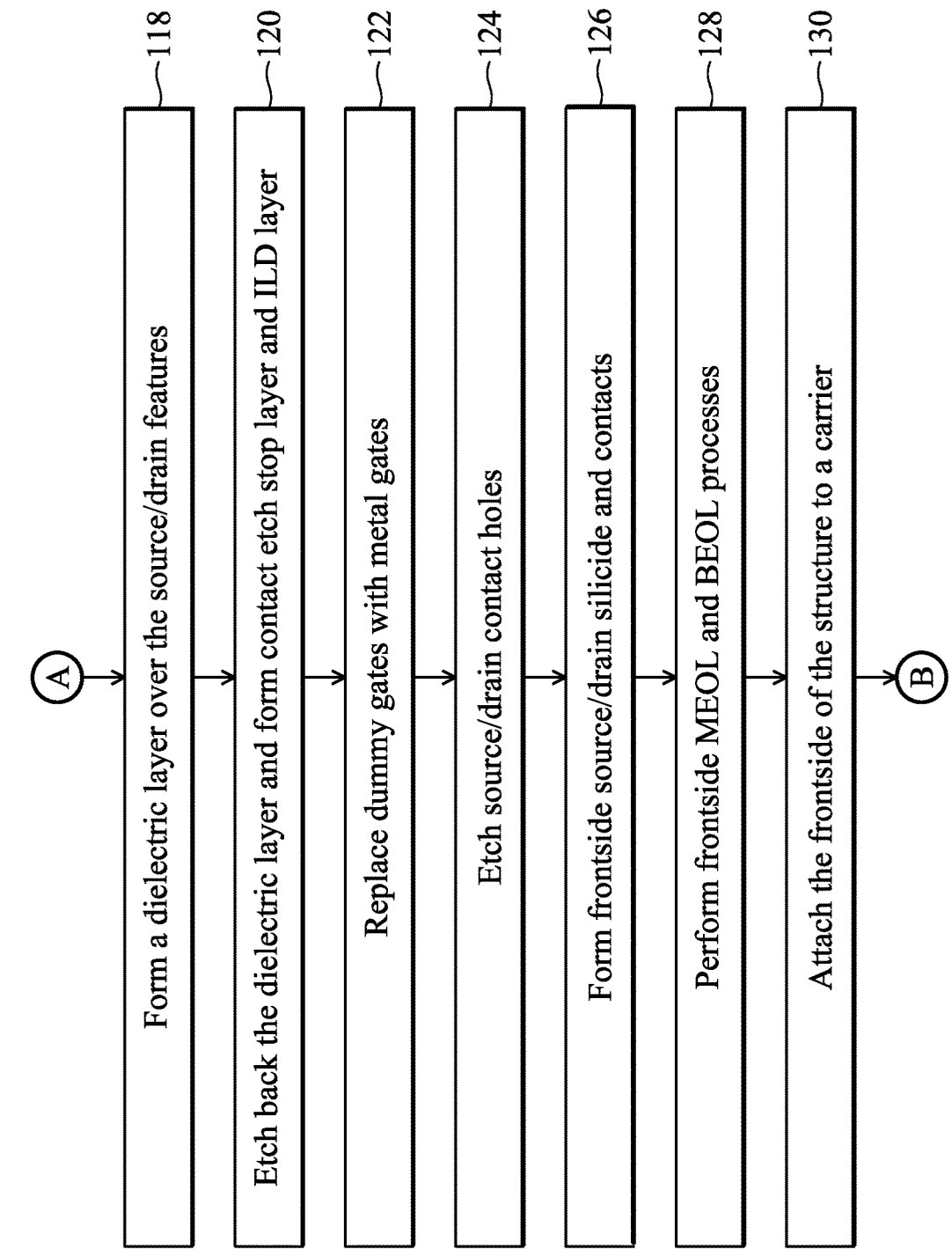
Figure 1C:
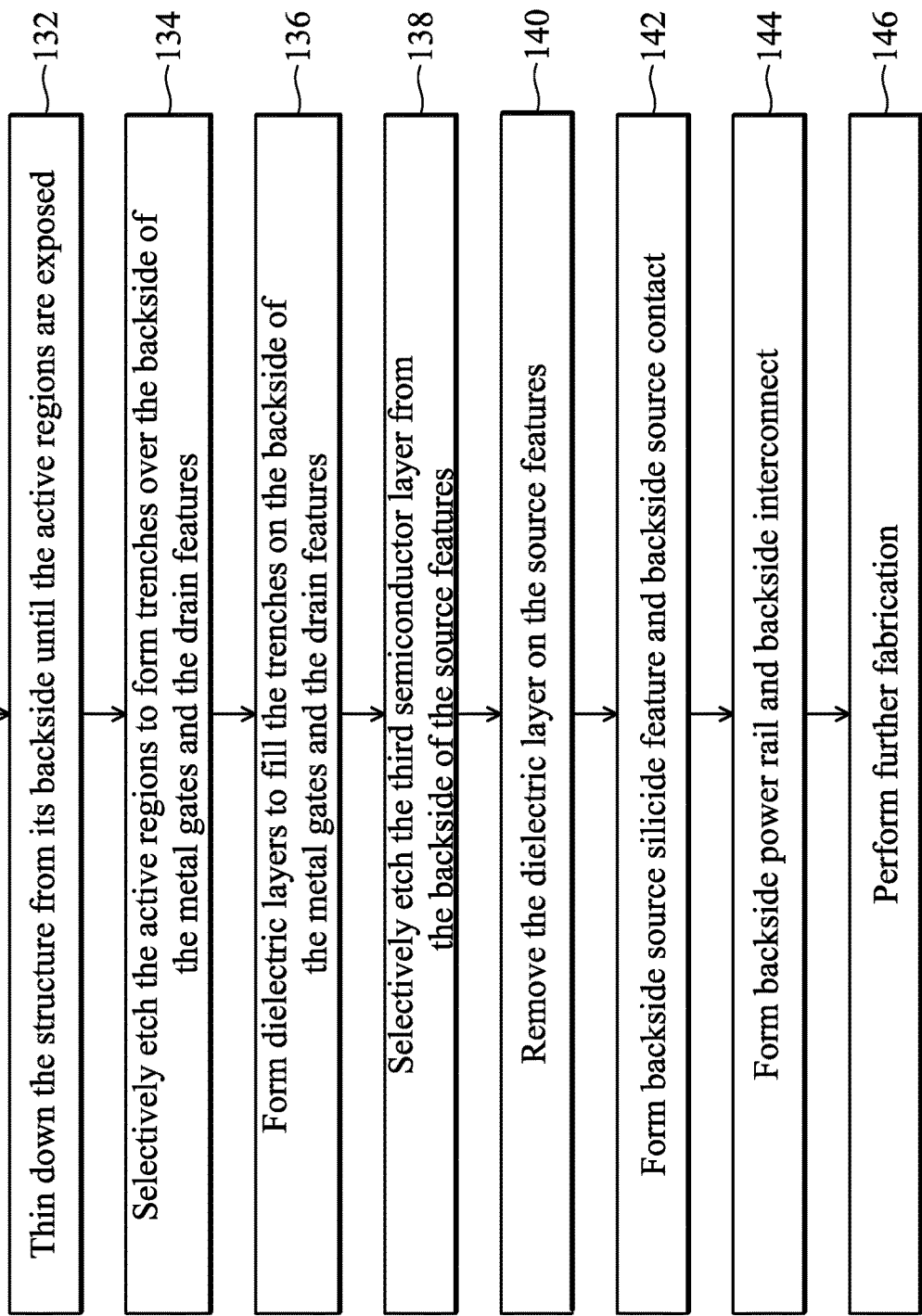

FIGS. 1A, 1B, and 1C are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 22B that illustrate various top and cross-sectional views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 22B have been simplified for the sake of clarity to better understand the inventive concepts of the present disclosure. Additional features can be added in the device 200, and some of the features described below can be replaced, modified, or eliminated in other embodiments of the device 200.

Figure 3:
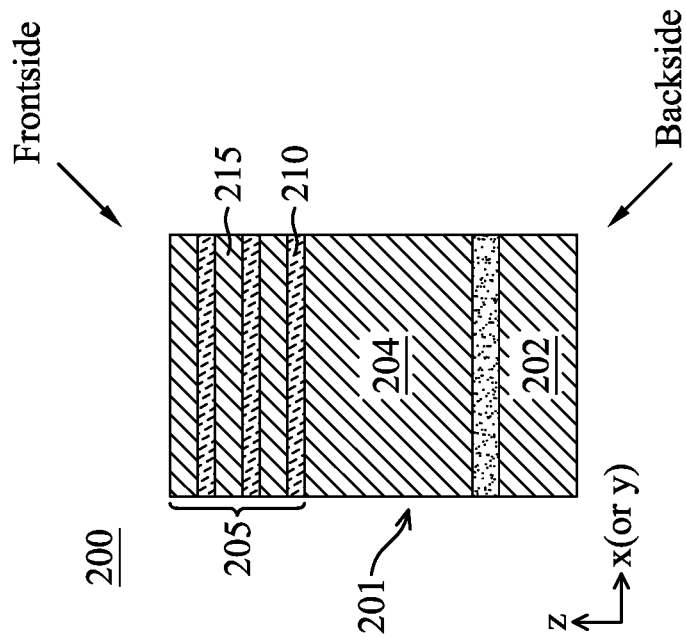
FIGS. 2 and 3 illustrate cross-sectional views of a portion of a semiconductor device, according to some embodiments, in intermediate steps of fabrication according to an embodiment of the method of FIGS. 1A-1C.
Figure 2:
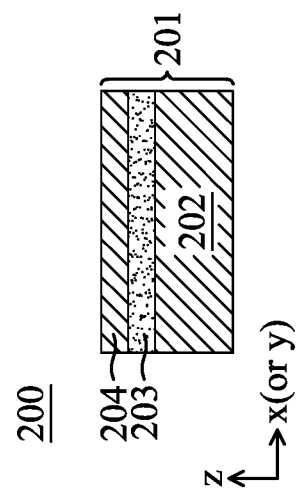

At operation 102, the method 100 (FIG. 1A) forms a stack 205 of first and second semiconductor layers over a substrate 201. The resultant structure is shown in FIGS. 2 and 3 according to an embodiment. Particularly, FIG. 2 illustrates the substrate 201 in an embodiment, and FIG. 3 illustrates a stack 205 of semiconductor layers 210 and 215 in an embodiment. In the depicted embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 includes a semiconductor layer 204, an insulator 203, and a carrier 202. In embodiments, the semiconductor layer 204 can be silicon, silicon germanium, germanium, or other suitable semiconductor; the carrier 202 may be part of a silicon wafer; and the insulator 203 may be silicon oxide. Semiconductor-on-insulator substrates can be fabricated using separation by implantation of oxygen (SIMOX), wafer bonding, and/or other suitable methods. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In some embodiment, the semiconductor layer 204 may include various doped regions depending on design requirements of the device 200. For example, N-type doped regions, can be formed by doping with n-type dopants, such as phosphorus, arsenic, other n-type dopant, or combinations thereof; and P-type doped regions can be formed by doping with p-type dopants, such as boron, indium, other p-type dopant, or combinations thereof. In some implementations, the semiconductor layer 204 includes doped regions formed with a combination of p-type dopants and n-type dopants. In some embodiment, the semiconductor layer 204 is undoped or unintentionally doped with a very low number of dopants.

The semiconductor layer stack 205 is formed over the substrate 201 and includes semiconductor layers 210 and semiconductor layers 215 stacked vertically (e.g., along the z-direction) in an interleaving or alternating configuration from a surface of the substrate 201. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 215, a second one of semiconductor layers 210 is epitaxially grown on the first one of semiconductor layers 210, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215 configured to form three semiconductor layer pairs disposed over substrate 201, each semiconductor layer pair having a respective first semiconductor layer 210 and a respective second semiconductor layer 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of Si. As will be discussed, the method 100 will process layers at both sides of the substrate 201. In the present disclosure, the side of the substrate 201 where the stack 205 resides is referred to as the frontside and the side opposite the frontside is referred to as the backside.

Figures 4A, 4B:
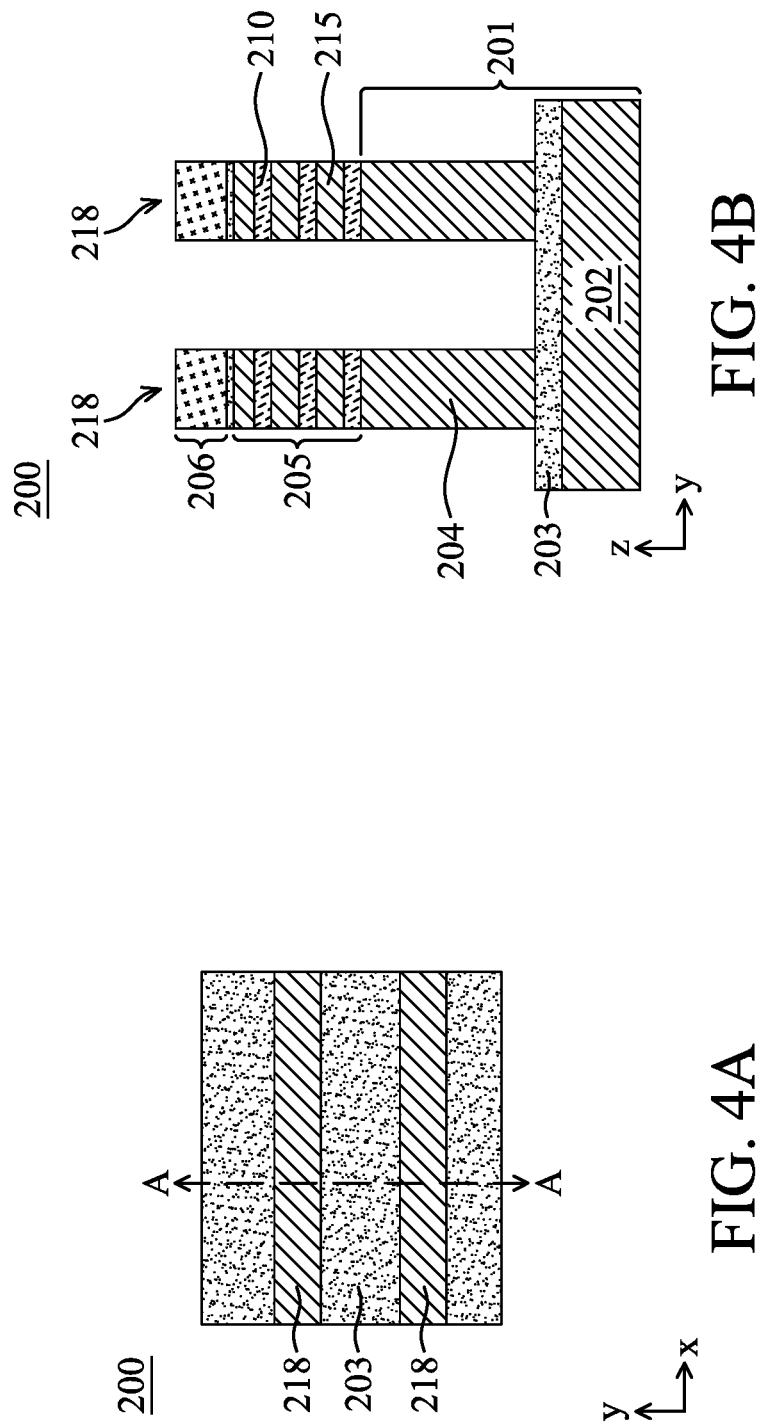

At operation 104, the method 100 (FIG. 1A) forms fins 218 by patterning the stack 205 and the substrate 201. FIG. 4A illustrates a top view of the device 200 with fins 218 oriented along the "x" direction. FIG. 4B illustrates a cross-sectional view of the device 200, in portion, along the A—A line in FIG. 4A. As illustrated in FIG. 4B, the fins 218 include the patterned stack 205 (having layers 210 and 215), patterned semiconductor layer 204, and one or more patterned hard mask layers 206. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C12$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

Figure 5E:
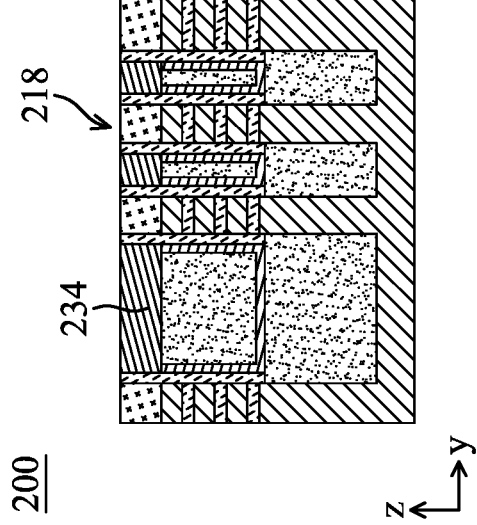

At operation 106, the method 100 (FIG. 1A) forms various isolation structures over the substrate 201 and isolate the fins 218, an embodiment of which is illustrated in FIGS. 5A-5G. FIG. 5A illustrates a top view of the device 200, and FIGS. 5B-5G illustrate cross-sectional views of the device 200, in portion, along the A-A line in FIG. 5A at various steps of the operation 106.

Referring to FIG. 5B, an isolation feature(s) 230 is formed over and/or in substrate 201 to isolate various regions of the device 200. For example, isolation features 230 surround a bottom portion of fins 218 to separate and isolate fins 218 from each other. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

Referring to FIG. 5C, a cladding layer 231 is deposited over the top and sidewall surfaces of the fins 218 and above the isolation features 230. In an embodiment, the cladding layer 231 includes SiGe. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After the cladding layer 231 is deposited, operation 106 performs an etching process to remove the portion of the cladding layer 231 from above the isolation features 230, for example, using a plasma dry etching process.

Referring to FIG. 5D, a dielectric liner 232 is deposited over the cladding layer 231 and on top surfaces of the isolation features 230, then a dielectric fill layer 233 is deposited over the dielectric liner 232 and fills the gaps between the fins 218. In an embodiment, the dielectric liner 232 includes a low-k dielectric material such as a dielectric material including Si, O, N, and C. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, or combinations thereof. Low-k dielectric material generally refers to dielectric materials having a low dielectric constant, for example, lower than that of silicon oxide (k 3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. After the layers 232 and 233 are deposited, the operation 106 may perform a CMP process to planarize the top surface of the device 200 and to expose the cladding layer 231.

Referring to FIG. 5E, a dielectric helmet 234 is deposited over the dielectric layers 232 and 233 and between the cladding layer 231 on opposing sidewalls of the fins 218. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. In an embodiment, the operation 106 includes recessing the dielectric layers 232 and 233 using a selective etching process that etches the dielectric layers 232 and 233 with no (or minimal) etching to the hard mask 206 and the cladding layer 231. Then, the operation 106 deposits one or more dielectric materials into the recesses and performs a CMP process to the one or more dielectric materials to form the dielectric helmet 234.

Figure 5G:
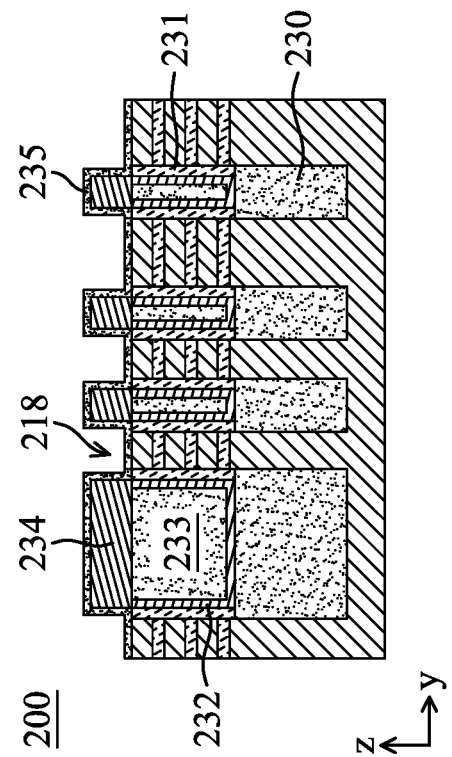
Figure 5F:
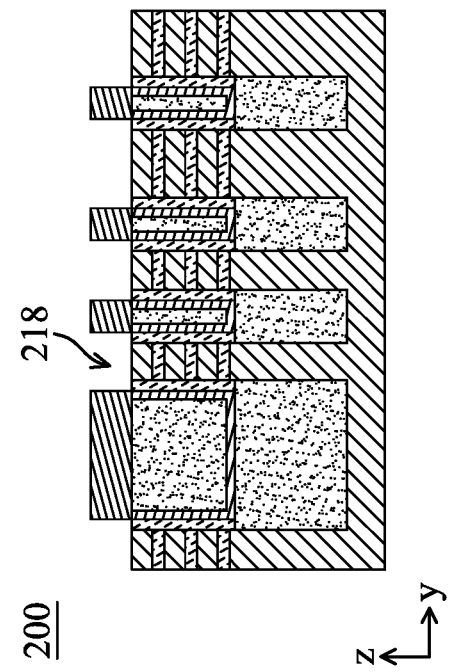

Referring to FIG. 5F, the operation 106 recesses the fins 218 (particularly removing the hard mask layers 206) and the cladding layer 231 that are disposed between the dielectric helmet 234. The operation 106 may apply one or more etching processes that are selective to the hard mask layers 206 and the cladding layer 231 and with no (or minimal) etching to the dielectric helmet 234. The selective etching processes can be dry etching, wet drying, reactive ion etching, or other suitable etching methods.

Referring to FIG. 5G, the operation 106 deposits a dielectric layer 235 over the surfaces of the fins 218 and over the dielectric helmet 234. In the present embodiment, the dielectric layer 235 is a dummy (or sacrificial) gate dielectric layer. The dummy gate dielectric 235 includes a dielectric material, such as silicon oxide, a high-k dielectric material, other suitable dielectric material, or combinations thereof and may be deposited using any of the processes described herein, such as ALD, CVD, PVD, other suitable process, or combinations thereof.

Figure 6B:
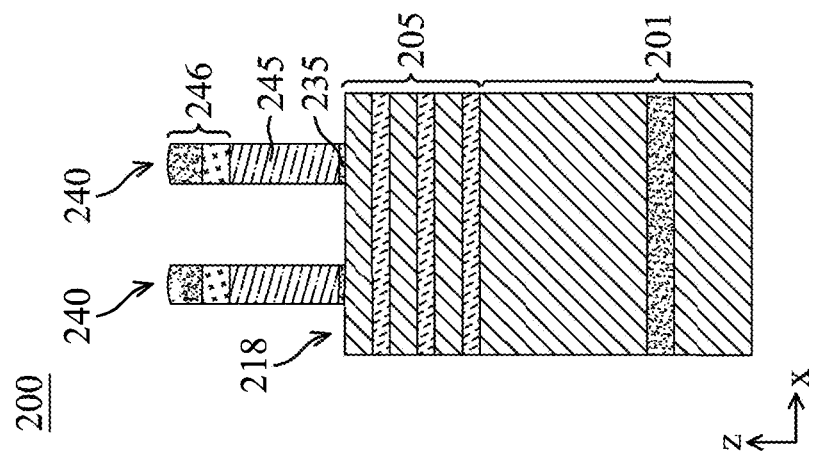
Figure 6A:
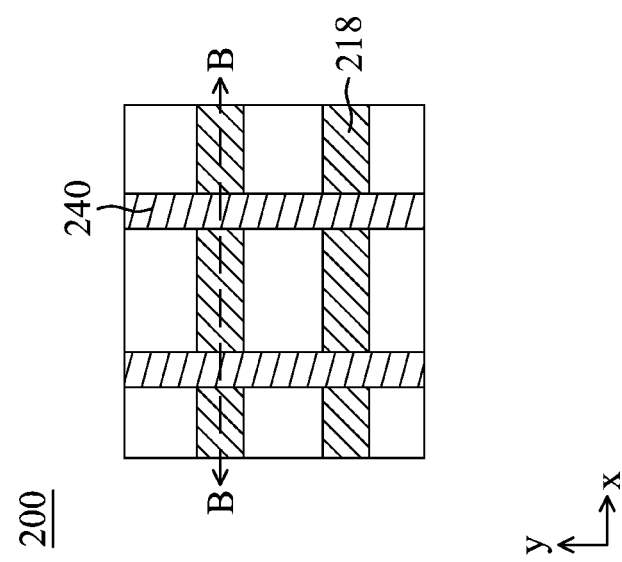

At operation 108, the method 100 (FIG. 1A) forms gate stacks 240 over the dummy gate dielectric 235. The resultant structure is shown in FIGS. 6A-6B according to an embodiment. FIG. 6A illustrates a top view of the device 200, and FIG. 6B illustrates a cross-sectional view of the device 200, in portion, along the B-B line in FIG. 6A. From a top view, the gate stacks 240 are oriented lengthwise generally along the "y" direction perpendicular to the "x" direction. In the present embodiment, the gate stacks 240 are dummy (or sacrificial) gate stacks and will be replaced with functional gate stacks 240'. Dummy gate stacks 240 are formed by deposition processes, lithography processes, etching processes, other suitable processes, or combinations thereof. For example, a deposition process is performed to form a dummy gate electrode layer 245 over the dummy gate dielectric layer 235. In some embodiment, one or more hard mask layers 246 are deposited over the dummy gate electrode layer 245. In some embodiments, the dummy gate electrode layer 245 includes polysilicon or other suitable material and the one or more hard mask layers 246 include silicon oxide, silicon nitride, or other suitable materials. The deposition process may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIG. 6B. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

The operation 108 may further form gate spacers 247 on sidewalls of the dummy gate stacks 240 (as shown in FIG. 7B). Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

At operation 110, the method 100 (FIG. 1A) forms source/drain (S/D) trenches 250 by etching the fins 218 adjacent the gate spacers 247. The resultant structure is shown in FIGS. 7A-7E according to an embodiment. FIG. 7A illustrates a top view of the device 200, and FIGS. 7B, 7C, 7D, and 7E illustrate cross-sectional views of the device 200, in portion, along the B-B line, the C-C line, the D-D line, and the E-E line in FIG. 7A, respectively. Particularly, the D-D line is cut into the source regions of the transistors and is parallel to the gate stacks 240, and the E-E line is cut into the drain regions of the transistors and is parallel to the gate stacks 240. The D-D lines and the E-E lines in FIGS. 8A through 21A are similarly configured.

In the depicted embodiment, an etching process completely removes semiconductor layer stack 205 in source/drain regions of fins 218 thereby exposing the substrate portion 204 of fins 218 in the source/drain regions. Source/ drain trenches 250 thus have sidewalls defined by remaining portions of semiconductor layer stack 205, which are disposed in channel regions under the gate stacks 240, and bottoms defined by substrate 201. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the substrate portion of fins 218, such that source/drain trenches 250 extend below a topmost surface of substrate 201. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask.

The operation 110 further forms inner spacers 255 (see FIG. 7B) along sidewalls of semiconductor layers 210 inside the S/D trenches 250. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and semiconductor layer 204 under gate spacers 247. Portions (edges) of semiconductor layers 215 are thus suspended in the channel regions under gate spacers 247. In some embodiments, the gaps extend partially under dummy gate stacks 240. The first etching process is configured to laterally etch (e.g., along the "x" direction) semiconductor layers 210, thereby reducing a length of semiconductor layers 210 along the "x" direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and semiconductor layer 204), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 201 under gate spacers 247. A second etching process is then performed that selectively etches the spacer layer to form inner spacers 255 as depicted in FIG. 7B with minimal (to no) etching of semiconductor layers 215, dummy gate stacks 240, and gate spacers 247. In some embodiments, the spacer layer is removed from sidewalls of gate spacers 247, sidewalls of semiconductor layers 215, dummy gate stacks 240, and substrate 201. The spacer layer (and thus inner spacers 255) includes a material that is different than a material of semiconductor layers 215 and a material of gate spacers 247 to achieve desired etching selectivity during the second etching process. In some embodiments, the spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. In embodiments where the device 200 is a FinFET, the inner spacer 255 is omitted.

Figure 8C:
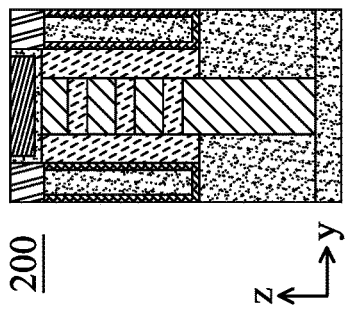
Figure 8D:
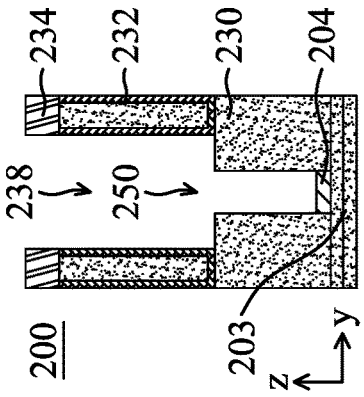
Figure 8E:
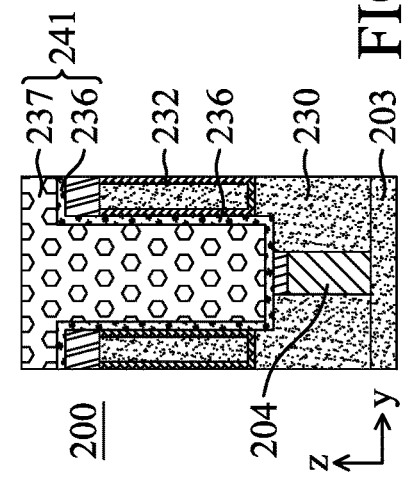
Figure 8B:
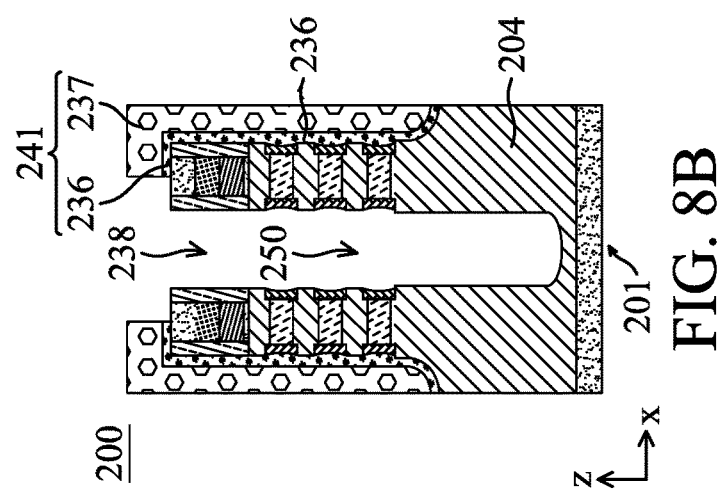
Figure 8A:
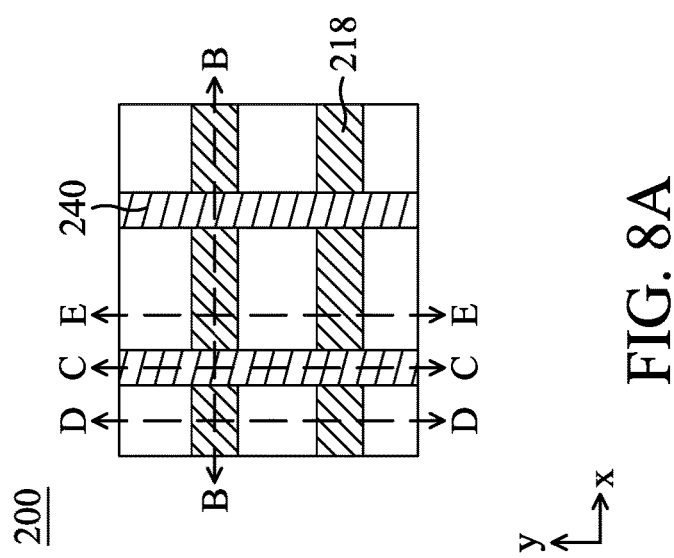

At operation 112, the method 100 (FIG. 1A) performs extra etching to the source region of the device 200. The resultant structure is shown in FIGS. 8A-8E according to an embodiment. FIG. 8A illustrates a top view of the device 200, and FIGS. 8B, 8C, 8D, and 8E illustrate cross-sectional views of the device 200, in portion, along the B-B line, the C-C line, the D-D line, and the E-E line in FIG. 8A, respectively.

In the depicted embodiment, the operation 112 forms an etch mask 241 that includes a patterned hard mask 236 and a patterned resist 237. The etch mask 241 covers the device 200 except the source regions, which are exposed through openings 238 in the etch mask 241. Then, the operation 112 etches the source regions deeply in the substrate 201 until only a thin layer 204 remains in the source trench 250, thereby extending the source trench 250 into the substrate 201. The etching process may include dry etching, wet etching, reactive ion etching, or other suitable etching. The etching process is substantially anisotropic (i.e., substantially vertical) in this embodiment. Also, the etching process is tuned selective to the material of the semiconductor layer 204 and with no (or minimal) etching to the gate spacers 247 and gate hard mask layers 246. The etching process in the operation 112 may be similar to the etching process in the operation 110. After the etching process finishes, the operation 112 removes the patterned resist 237, for example, by a stripping process.

Figure 9C:
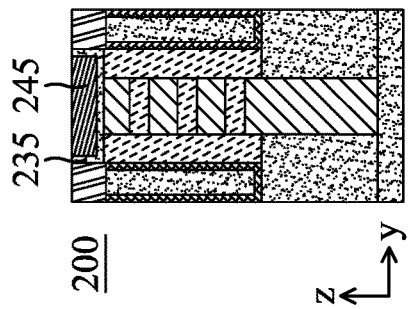
Figure 9D:
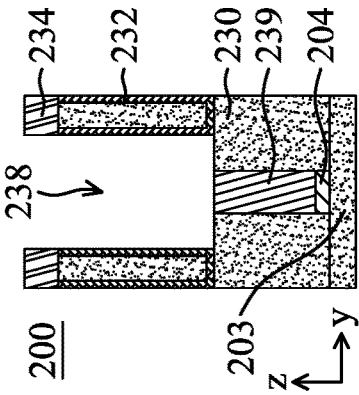
Figure 9E:
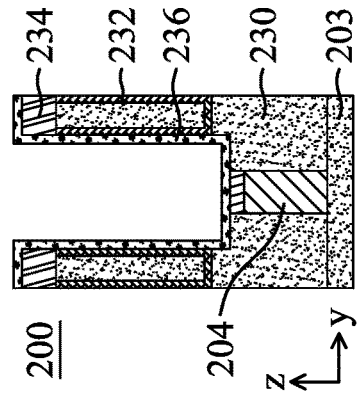
Figure 9B:
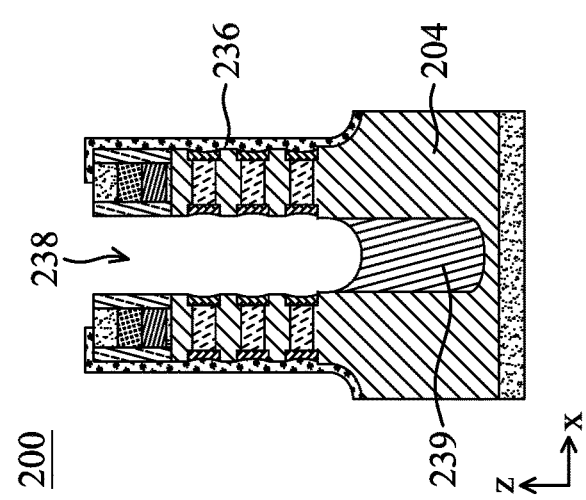
Figure 9A:
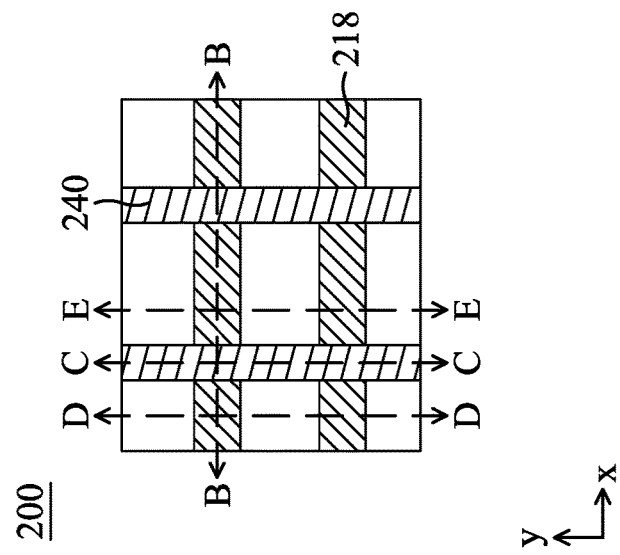

At operation 114, the method 100 (FIG. 1A) forms a semiconductor layer 239 in the source trenches 250. The resultant structure is shown in FIGS. 9A-9E according to an embodiment. FIG. 9A illustrates a top view of the device 200, and FIGS. 9B, 9C, 9D, and 9E illustrate cross-sectional views of the device 200, in portion, along the B-B line, the C-C line, the D-D line, and the E-E line in FIG. 9A, respectively.

The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 204 to achieve etching selectivity during subsequent processing. For example, semiconductor layers 239 and 204 may include different materials, different constituent atomic percentages, different constituent weight percentages, and/or other characteristics to achieve desired etching selectivity during an etching process. In an embodiment, the semiconductor layer 204 includes silicon and the semiconductor layer 239 includes silicon germanium. In another embodiment, semiconductor layers 239 and 204 can both include silicon germanium, but with different silicon atomic percent. The present disclosure contemplates that semiconductor layers 239 and 204 include any combination of semiconductor materials that can provide desired etching selectivity, including any of the semiconductor materials disclosed herein. Since the drain regions (FIG. 9E) are covered by the patterned hard mask layer 236, the semiconductor layer 239 is only deposited in the source regions (FIG. 9D). The semiconductor layer 239 is deposited to a thickness such that it is near the bottom of the stack 205 (FIG. 9B) and is about level with the top surface of the isolation features 230 (FIG. 9D). The operation 114 may include an etching process that recesses the semiconductor layer 239 to the level shown in FIGS. 9B and 9D if the semiconductor layer 239 is initially grown taller than that. After the semiconductor layer 239 is deposited, the operation 114 removes the patterned hard mask layer 236 by one or more etching processes. As will be discussed below, the extra etching in the operation 112 and the growing of the semiconductor layer 239 in the operation 114 can be performed in source regions only, drain regions only, or both source and drain regions in various embodiments.

At operation 116, the method 100 (FIG. 1A) epitaxially grows semiconductor S/D features 260 in the S/D trenches 250. The resultant structure is shown in FIGS. 10A-10E according to an embodiment. FIG. 10A illustrates a top view of the device 200, and FIGS. 10B, 10C, 10D, and 10E illustrate cross-sectional views of the device 200, in portion, along the B-B line, the C-C line, the D-D line, and the E-E line in FIG. 10A, respectively.

Figure 10C:
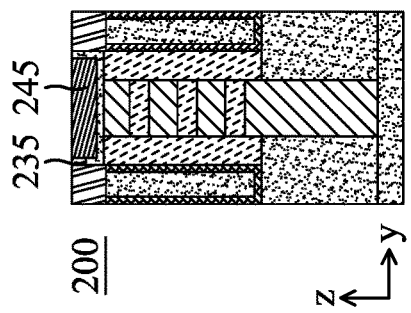
Figure 10D:
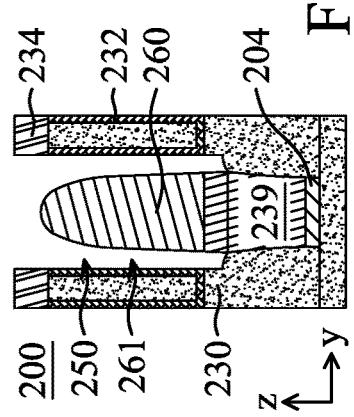
Figure 10E:
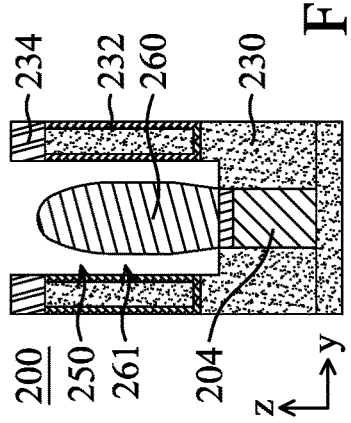
Figure 10B:
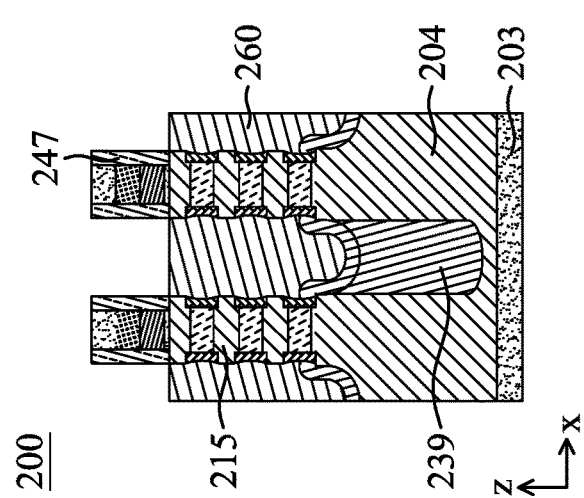
Figure 10A:
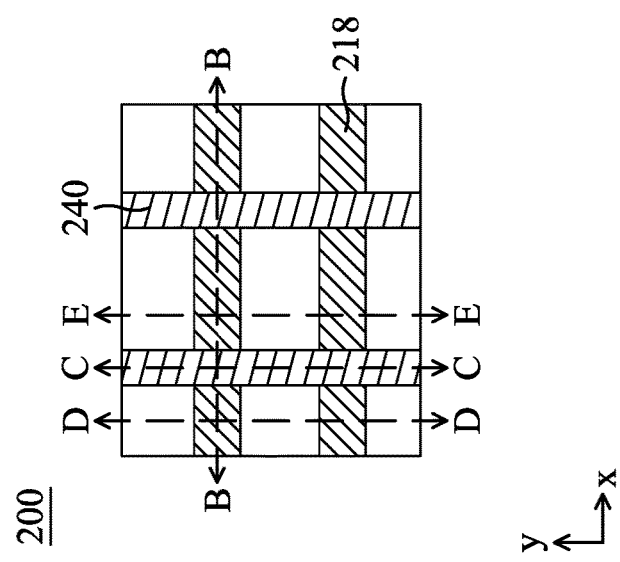

As shown in FIGS. 10B, 10D, and 10E, epitaxial S/D features 260 are grown from the semiconductor layers 204 and 239 at the bottom of the S/D trenches 250 and from the semiconductor layers 215 at the sidewalls of the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 204, 239, and 215 (in particular, semiconductor layers 215). Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. Further, in an embodiment, the S/D feature 260 (or at least its portion adjoining to the semiconductor layer 239) includes a different material composition than the semiconductor layer 239 to achieve etch selectivity during backside via formation process. For example, in an embodiment, the semiconductor layer 239 include SiGe and the S/D feature 260 includes Si (for n-type transistor). For example, in another embodiment, the semiconductor layer 239 include SiGe with a first Ge atomic percent and the S/D feature 260 includes SiGe (for p-type transistor) with a second Ge atomic percent and the first and the second Ge atomic percent are different. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions. Further, as shown in FIGS. 10D and 10E, the S/D features 260 are formed into bar-like shapes and do not fully fill the S/D trenches 250, leaving some gaps 261 between the S/D features 260 and the dielectric layer 232 and the isolation features 230. In some embodiments, the gap 261 extend a distance in a range of about 1 nm to about 10 nm along the "y" direction. If the gap 261 is too narrow (such as less than 1 nm), then there is not enough room for depositing a dielectric layer 262 and for forming air gap 263 as will be discussed with reference to FIGS. 11A-E and FIGS. 12A-E. If the gap 261 is too broad (such as larger than 10 nm), then either the device integration would be hindered or the S/D features 260 would be too small to achieve good device performance.

At operation 118, the method 100 (FIG. 1B) forms a dielectric layer 262 over the S/D features 260 and in the S/D trenches 250. The resultant structure is shown in FIGS. 11A-11E according to an embodiment. FIG. 11A illustrates a top view of the device 200, and FIGS. 11B, 11C, 11D, and 11E illustrate cross-sectional views of the device 200, in portion, along the B-B line, the C-C line, the D-D line, and the E-E line in FIG. 11A, respectively.

Figure 11C:
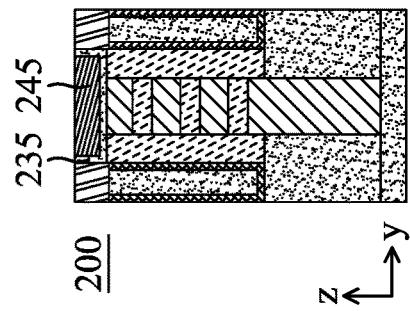
Figure 11D:
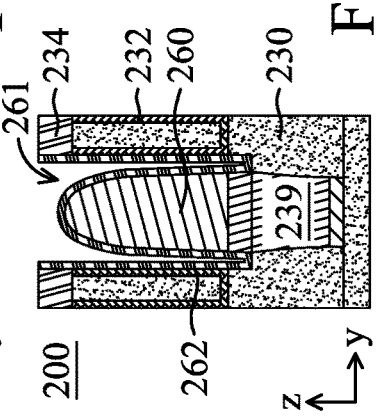
Figure 11E:
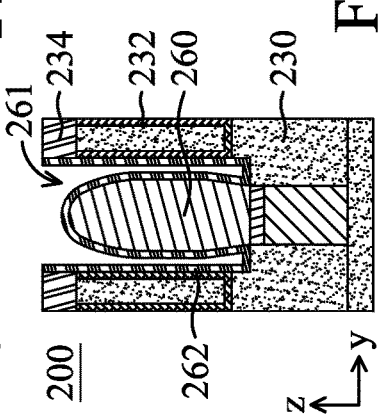
Figure 11B:
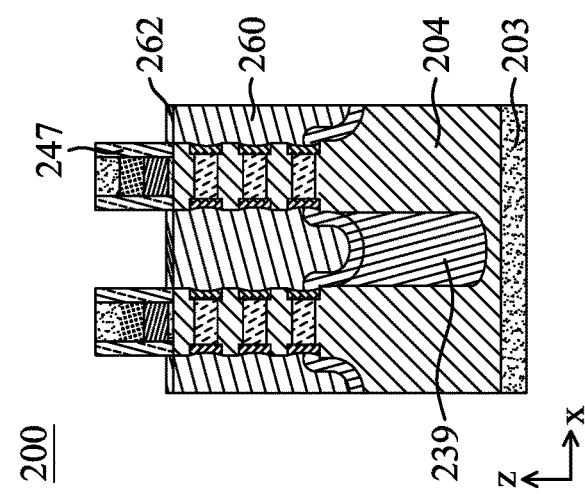
Figure 11A:
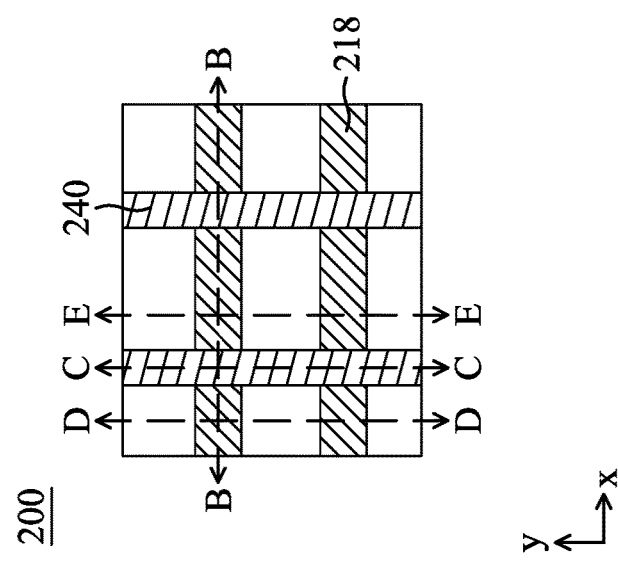

As shown in FIGS. 11B, 11D, and 11E, the dielectric layer 262 is deposited on the top surface and the sidewall surfaces of the S/D features 260 and on the surfaces of the S/D trenches 250. In an embodiment, the dielectric layer 262 is deposited to have a substantially uniform thickness, such as in a range of from about 0.2 nm to about 4 nm. This range of thickness is designed to be thin enough to create the air gap 263 (such as in FIG. 12E), yet thick enough to seal the air gap 263 against its surrounding features. Generally, a larger air gap 263 is more desirable for reducing stray capacitance associated with the S/D features 260. In the present embodiment, the dielectric layer 262 includes a material that achieves etch selectivity in an etchant with respect to the S/D features 260 and the dielectric layers 232, 234 and 230. In other words, the etchant is able to etch the dielectric layer 262 and with no (or minimal) etching to the S/D features 260, the dielectric layer 234, the dielectric layer 232, and the isolation features 230 in later fabrication steps. In various embodiments, the dielectric layer 262 may include alumina ($Al_2O_3$), other oxides, silicon nitride ($Si_3N_4$), silicon carbonitride (SiCN), silicon oxycarbonitride (SiOCN), or other dielectric materials.

Figure 12C:
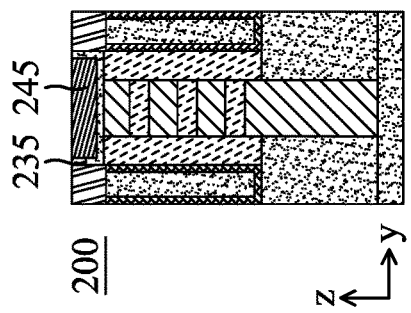
Figure 12D:
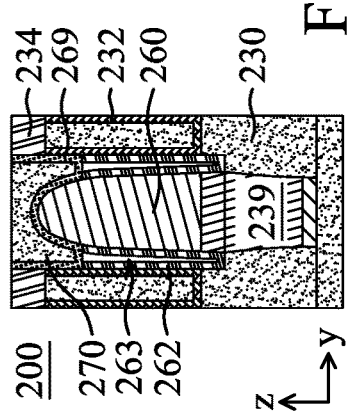
Figure 12E:
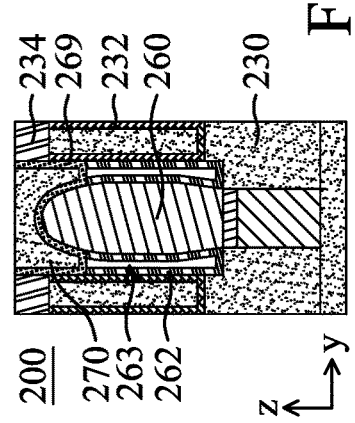
Figure 12B:
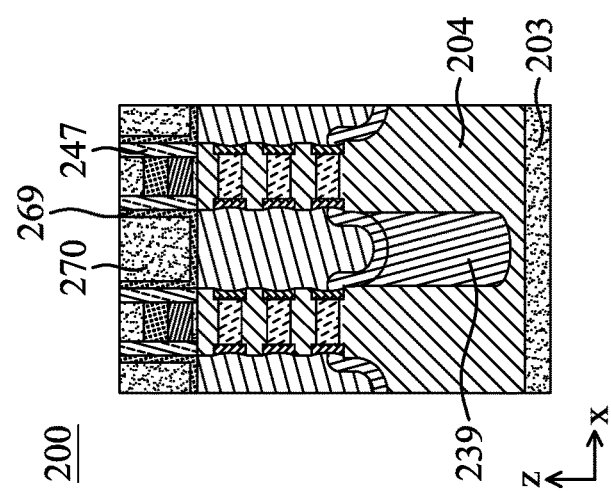
Figure 12A:
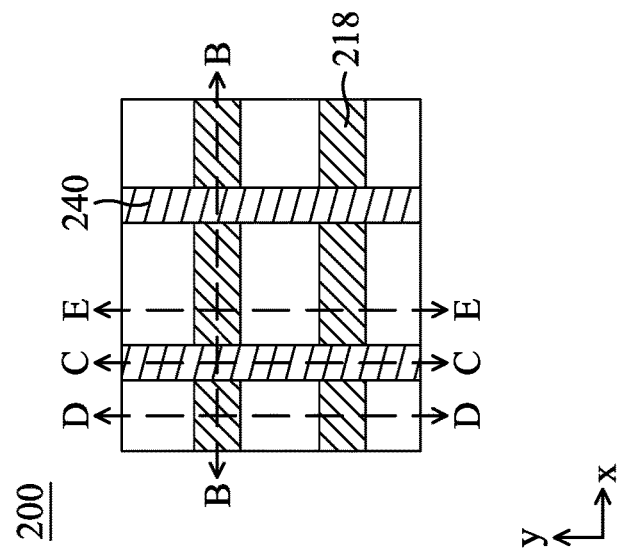

At operation 120, the method 100 (FIG. 1B) etches back the dielectric layer 262 and forms a contact etch stop layer (CESL) 269 and an inter-layer dielectric (ILD) layer 270. The resultant structure is shown in FIGS. 12A-12E according to an embodiment. FIG. 12A illustrates a top view of the device 200, and FIGS. 12B, 12C, 12D, and 12E illustrate cross-sectional views of the device 200, in portion, along the B-B line, the C-C line, the D-D line, and the E-E line in FIG. 12A, respectively.

As shown in FIGS. 12B-12E, the dielectric layer 262 is partially recessed and the CESL 269 is deposited over the dielectric layer 262 and the S/D features 260. An air gap is sealed by the dielectric layer 262 and the CESL 269. The ILD layer 270 is deposited over the CESL 269 and fills the space between opposing gate spacers 247. The CESL 269 includes a material that is different than ILD layer 270 and different than the dielectric layer 234. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask layers 246 of dummy gate stacks 240 to expose underlying dummy gate electrodes 245, such as polysilicon gate electrode layers.

Figure 13C:
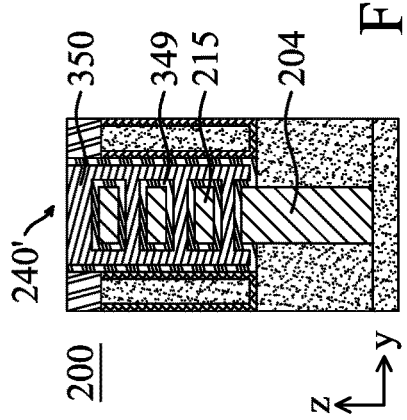
Figure 13D:
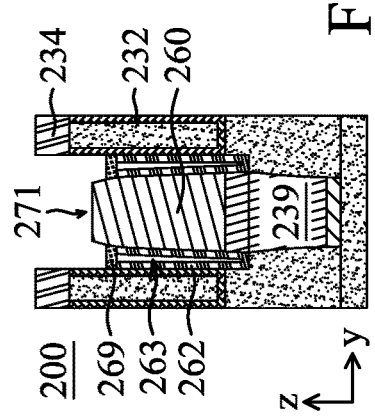
Figure 13E:
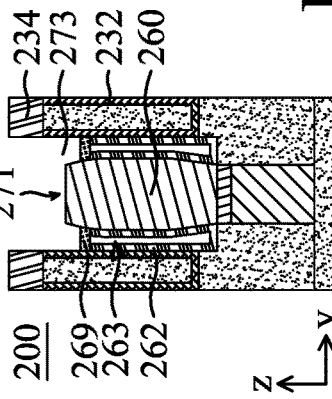
Figure 13B:
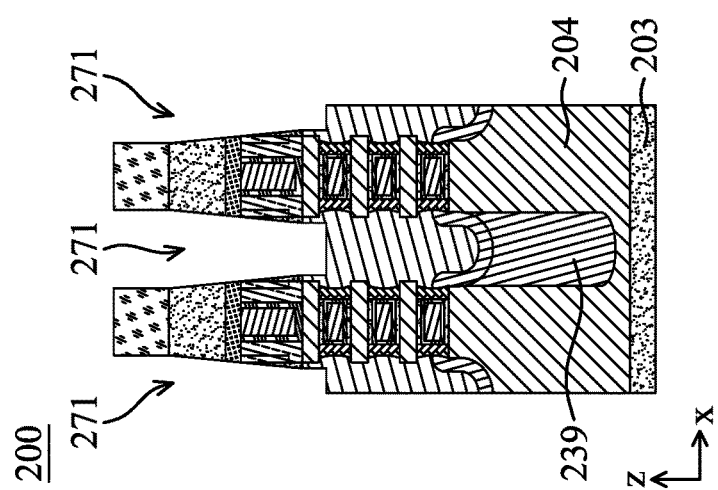
Figure 13A:
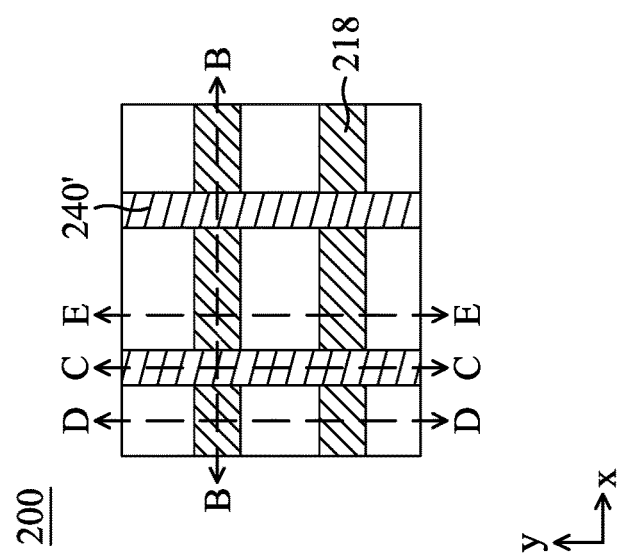

At operation 122, the method 100 (FIG. 1B) replaces the dummy gate stacks 240 with functional gate stack 240' (such as high-k metal gates). The resultant structure is shown in FIGS. 13A, 13B, and 13C according to an embodiment. FIG. 13A illustrates a top view of the device 200, and FIGS. 13B and 13C illustrate cross-sectional views of the device 200, in portion, along the B-B line and the C-C line in FIG. 13A, respectively. This involves a variety of processes as briefly described below.

First, the operation 122 removes the dummy gate stacks 240 (the dummy gate electrodes 245 and the dummy gate dielectric layer 235, see FIG. 6B) using one or more etching process. This forms a gate trench. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, cladding layer 231, semiconductor layers 215, and semiconductor layers 210.

Next, the operation 122 removes the cladding layer 231 exposed in the gate trench. The etching process may selectively etch the cladding layer 231 with minimal (to no) etching of semiconductor layers 215, gate spacers 247, and inner spacers 255.

Next, the operation 122 removes the semiconductor layers 210 exposed in the gate trench, leaving the semiconductor layers 215 suspended over the semiconductor layer 204 and connected with the S/D features 260. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255. In embodiments where the device 200 is a FinFET, the channel release process is omitted because there is only a channel layer 215 and there are no semiconductor layers 210 in the channel region.

Next, the operation 122 forms a gate dielectric layer 349 that wraps around each of the semiconductor layers 215 and forms a gate electrode 350 over the gate dielectric layer 349. The functional gate stack 240' comprises the gate dielectric layer 349 and the gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k 3.9). The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

At operation 124, the method 100 (FIG. 1B) etches S/D contact holes 271 to expose some of the S/D features 260. The resultant structure is shown in FIGS. 13A, 13B, 13D, and 13E according to an embodiment. FIG. 13A illustrates a top view of the device 200, and FIGS. 13B, 13D, and 13E illustrate cross-sectional views of the device 200, in portion, along the B-B line, the D-D line, and the E-E line in FIG. 13A, respectively. The operation 124 may include one or more etching processes that are tuned selective to the materials of the ILD layer 270 and the CESL 269 with no (or minimal) etching to the dielectric layers 234 and 232. The S/D features 260 may be partially etched in some embodiments. The etching processes can be dry etching, wet etching, reactive ion etching, or other etching methods. Further, the operation 124 controls the etching processes such that the dielectric layer 262 is not exposed in the contact holes 271. For example, the operation 124 may use a timer to control the etch depth. In some embodiments, the CESL 269 and the S/D features 260 form the bottom surfaces of the contact holes 271. In some embodiments, the CESL 269, the ILD layer 270, and the S/D features 260 form the bottom surfaces of the contact holes 271. The air gap 263 remain sealed by the dielectric layer 262 and the CESL 269.

At operation 126, the method 100 (FIG. 1B) form silicide features 273 over the S/D features 260 and form S/D contacts (or vias) 275 over the silicide features 273. The resultant structure is shown in FIGS. 14A-14E according to an embodiment. FIG. 14A illustrates a top view of the device 200, and FIGS. 14B, 14C, 14D, and 14E illustrate cross-sectional views of the device 200, in portion, along the B-B line, the C-C line, the D-D line, and the E-E line in FIG. 14A, respectively. Since the silicide features 273 and the S/D contacts 275 are formed at the frontside of the device 200, they are also referred to as frontside silicide features 273 and frontside S/D contacts 275 respectively.

In an embodiment, the operation 126 includes depositing one or more metals into the holes 271, performing an annealing process to the device 200 to cause reaction between the one or more metals and the S/D features 260 to produce the silicide features 273, and removing un-reacted portions of the one or more metals, leaving the silicide features 273 in the holes 271. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer functions to prevent metal materials of the metal fill layer from diffusing into the dielectric layers adjacent the S/D contacts 275, such as the layers 232, 234, 269, and 270. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275. The operation 126 may perform a CMP process to remove excessive materials of the S/D contacts 275.

At operation 128, the method 100 (FIG. 1B) performs mid-end-of-line (MEOL) processes and back-end-of-line (BEOL) processes at the frontside of the device 200. For example, the operation 128 may form gate vias connecting to the gate stacks 240', form S/D contact vias connecting to the S/D contacts 275, and form one or more interconnect layers with wires and vias embedded in dielectric layers. The one or more interconnect layers connecting gate, source, and drain electrodes of various transistors, as well as other circuits in the device 200, to form an integrated circuit in part or in whole. The operation 128 may also form passivation layer(s) over the interconnect layers. In the example shown in FIG. 15B, a layer 277 is used to denote various dielectric and metal layers including interconnect layers and passivation layers formed at the frontside of the device 200 over the S/D contacts 275. It is noted that the device 200 is flipped upside down in FIG. 15B.

At operation 130, the method 100 (FIG. 1B) flips the device 200 upside down and attaches the frontside of the device 200 to a carrier 370, such as shown in FIG. 15B. FIG. 15A illustrates a top view of the device 200, and FIGS. 15B, 15C, 15D, and 15E illustrate cross-sectional views of the device 200, in portion, along the B-B line, the C-C line, the D-D line, and the E-E line in FIG. 15A, respectively. This makes the device 200 accessible from the backside of the device 200 for further processing. The operation 130 may use any suitable attaching processes, such as direct bonding, hybrid bonding, using adhesive, or other bonding methods. The operation 130 may further include alignment, annealing, and/or other processes. The carrier 370 may be a silicon wafer in some embodiment. In FIGS. 15B-15E (as well as in other figures to be described below), the "z" direction points from the backside of the device 200 to the frontside of the device 200, while the "−z" direction points from the frontside of the device 200 to the backside of the device 200.

At operation 132, the method 100 (FIG. 1C) thins down the device 200 from the backside of the device 200 until the semiconductor layer 204 is exposed from the backside of the device 200. The resultant structure is shown in FIGS. 16A-16E according to an embodiment. FIG. 16A illustrates a top view of the device 200, and FIGS. 16B, 16C, 16D, and 16E illustrate cross-sectional views of the device 200, in portion, along the B-B line, the C-C line, the D-D line, and the E-E line in FIG. 16A, respectively. The isolation features 230 and the semiconductor layer 239 may or may not be exposed by the operation 132 in various embodiments. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figure 17C:
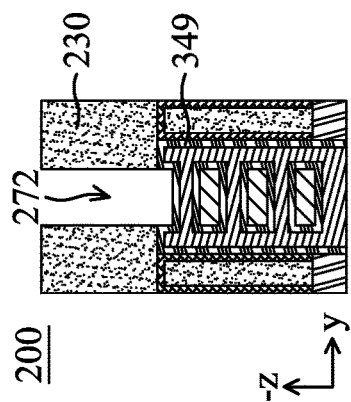
Figure 17D:
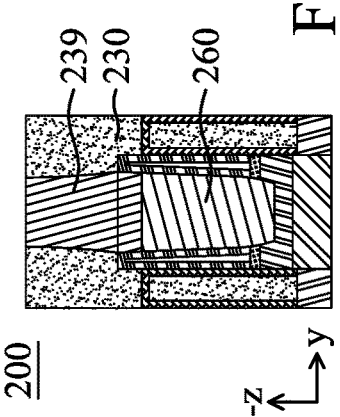
Figure 17E:
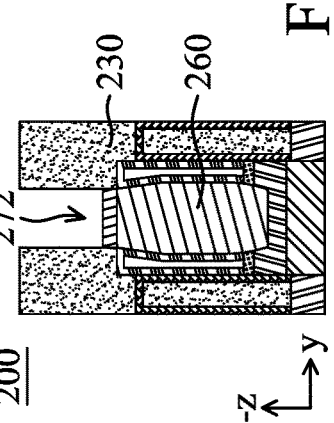
Figure 17B:
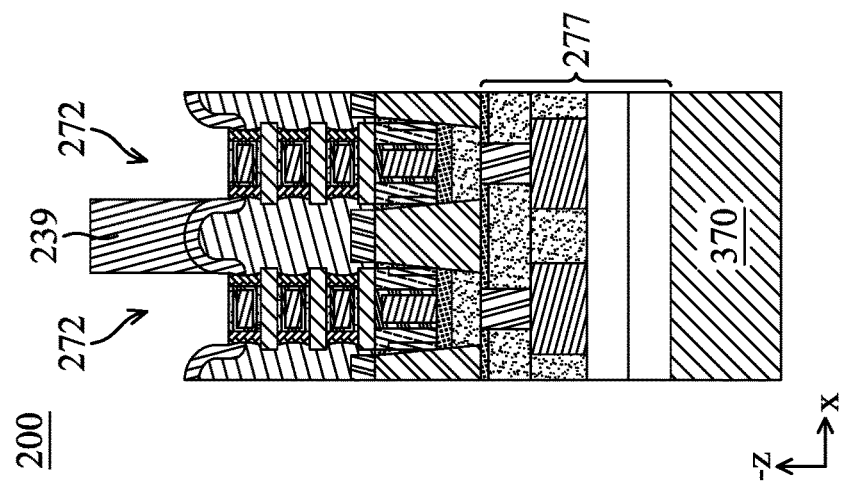
Figure 17A:
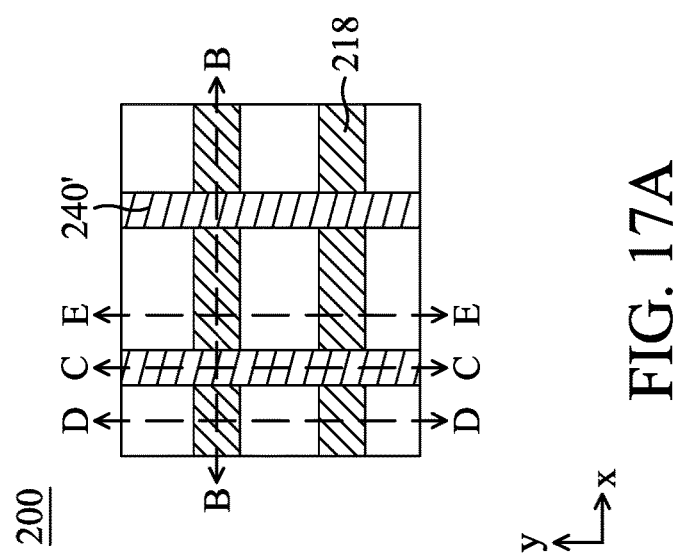

At operation 134, the method 100 (FIG. 1C) selectively etches the semiconductor layer 204 to form trenches 272 over the backside of the gate stacks 240' and the drain features 260. The resultant structure is shown in FIGS. 17A-17E according to an embodiment. FIG. 17A illustrates a top view of the device 200, and FIGS. 17B, 17C, 17D, and 17E illustrate cross-sectional views of the device 200, in portion, along the B-B line, the C-C line, the D-D line, and the E-E line in FIG. 17A, respectively. In the present embodiment, the operation 134 applies an etching process that is tuned to be selective to the materials of the semiconductor layer 204 (such as Si in an embodiment) and with no (or minimal) etching to the drain features 260, the gate stacks 240' (particularly the gate dielectric layer 349 and the gate interfacial layer if present), the isolation features 230, and the semiconductor layer 239 (such as SiGe in an embodiment). The etching process can be dry etching, wet etching, reactive ion etching, or other etching methods. Particularly, in the present embodiment, the etching of the semiconductor layer 204 is self-aligned. In other words, the operation 134 does not need to make an etch mask (e.g., an etch mask formed by photolithography processes) in order to etch the semiconductor layer 204. Rather, it relies on the etch selectivity of the materials in the semiconductor layer 204 and its surrounding layers.

At operation 136, the method 100 (FIG. 1C) forms a dielectric liner 274 and one or more dielectric layers 276 to fill the trenches 272. The resultant structure is shown in FIGS. 18A-18E according to an embodiment. FIG. 18A illustrates a top view of the device 200, and FIGS. 18B, 18C, 18D, and 18E illustrate cross-sectional views of the device 200, in portion, along the B-B line, the C-C line, the D-D line, and the E-E line in FIG. 18A, respectively. In an embodiment, the dielectric liner 274 includes silicon nitride and the dielectric layer(s) 276 includes silicon oxide. In some embodiments, the dielectric liner 274 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric layer 274 may have a substantially uniform thickness along the various surfaces of the trenches 272, and may be formed by CVD, PVD, ALD, or other suitable methods. In some embodiments, the dielectric layer(s) 276 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods. The operation 136 may further perform a CMP process to planarize the backside of the device 200 and to expose the semiconductor layer 239 for further processing.

Figure 19C:
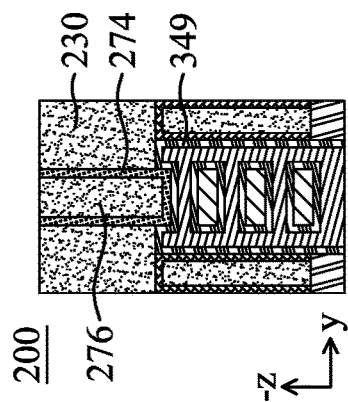
Figure 19D:
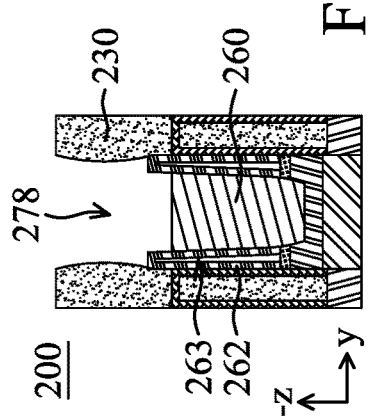
Figure 19E:
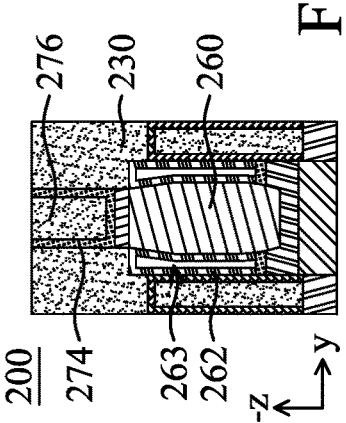
Figure 19B:
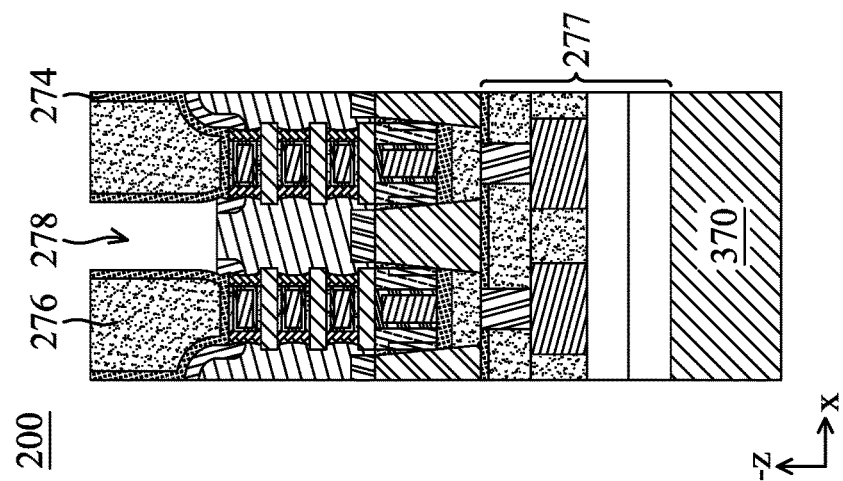
Figure 19A:
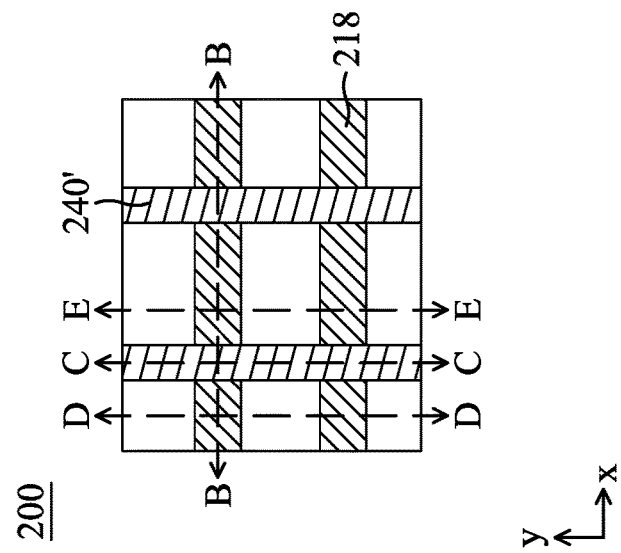

At operation 138, the method 100 (FIG. 1C) removes the semiconductor layer 239 from the backside of the device 200. The resultant structure is shown in FIGS. 19A-19E according to an embodiment. FIG. 19A illustrates a top view of the device 200, and FIGS. 19B, 19C, 19D, and 19E illustrate cross-sectional views of the device 200, in portion, along the B-B line, the C-C line, the D-D line, and the E-E line in FIG. 19A, respectively. In the present embodiment, the operation 138 applies an etching process that is tuned to be selective to the materials of the semiconductor layer 239 (such as SiGe in an embodiment) and with no (or minimal) etching to the dielectric liner 274, the dielectric layer(s) 276, the isolation features 230, and the dielectric layer 262. The etching process may partially etch the source feature 260. The etching process results in a trench 278 that exposes the source feature 260 from the backside of the device 200. The etching process can be dry etching, wet etching, reactive ion etching, or other etching methods. Particularly, in the present embodiment, the etching of the semiconductor layer 239 is self-aligned. In other words, the operation 138 does not need to make an etch mask (e.g., an etch mask formed by photolithography processes) in order to etch the semiconductor layer 239. Rather, it relies on the etch selectivity of the materials in the semiconductor layer 239 and its surrounding layers. This beneficially forms the trenches 278 to be aligned with the underlying source feature 260 without misalignments such as those introduced by photolithography overlay shift. Using this process will result in a backside source contact (or source via) that is ideally aligned with the source feature 260, as will be discussed below.

Figure 20C:
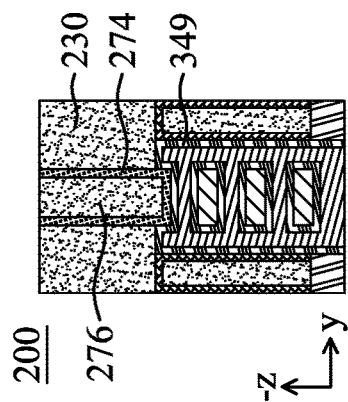
Figure 20D:
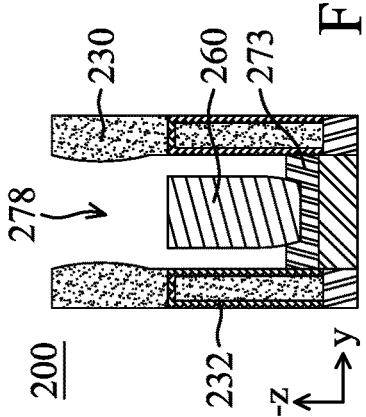
Figure 20E:
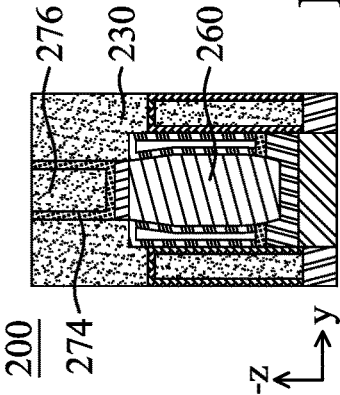
Figure 20B:
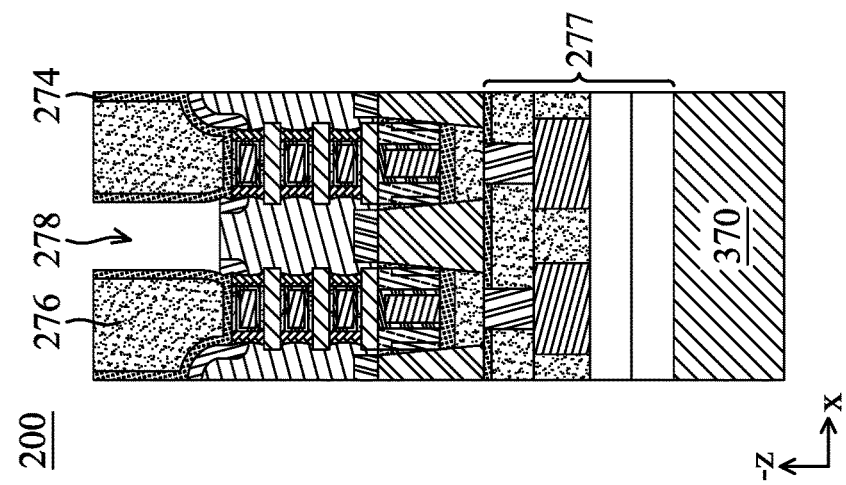
Figure 20A:
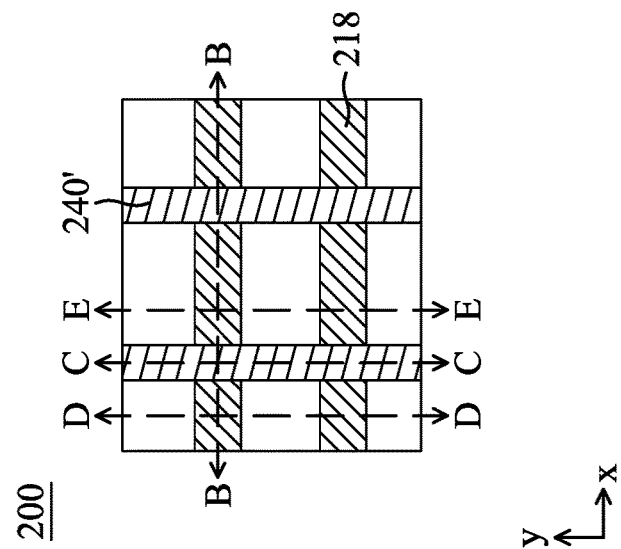

At operation 140, the method 100 (FIG. 1C) removes the dielectric layer 262 exposed in the trenches 278 from the backside of the device 200. The resultant structure is shown in FIGS. 20A-20E according to an embodiment. FIG. 20A illustrates a top view of the device 200, and FIGS. 20B, 20C, 20D, and 20E illustrate cross-sectional views of the device 200, in portion, along the B-B line, the C-C line, the D-D line, and the E-E line in FIG. 20A, respectively. In the present embodiment, the operation 140 applies an etching process that is tuned to be selective to the materials of the dielectric layer 262 and with no (or minimal) etching to the dielectric liner 274, the dielectric layer(s) 276, the isolation features 230, the dielectric layer 232, the frontside silicide feature 273, and the source feature 260. In some embodiments, the etching process may partially etch the source feature 260 and/or the silicide feature 273. As a result of the etching process, the trench 278 now exposes multiple surfaces of the source feature 260 (particularly the side surfaces of the source feature 260) as well as the silicide feature 273. The etching process can be dry etching, wet etching, reactive ion etching, or other etching methods. Particularly, in the present embodiment, the etching of the dielectric layer 262 is self-aligned. In other words, the operation 140 does not need to make an etch mask (e.g., an etch mask formed by photolithography processes) in order to etch the dielectric layer 262. Rather, it relies on the etch selectivity of the materials in the dielectric layer 262 and its surrounding layers.

At operation 142, the method 100 (FIG. 1C) forms a backside source silicide feature 280 and a backside source contact 282. The resultant structure is shown in FIGS. 21A-21E according to an embodiment. FIG. 21A illustrates a top view of the device 200, and FIGS. 21B, 21C, 21D, and 21E illustrate cross-sectional views of the device 200, in portion, along the B-B line, the C-C line, the D-D line, and the E-E line in FIG. 21A, respectively. As illustrated in FIG. 21D, the silicide feature 280 wraps around three surfaces of the source feature 260 including the backside surface and two sidewall surfaces. The backside source silicide feature 280 and the frontside source silicide feature 273 are connected. In other words, the source feature 260 is fully wrapped around by the silicide features 273 and 280 from this cross-sectional view. This advantageously reduces the source resistance. In the "x" direction, the source feature 260 is connected to the channel layers 215 as shown in FIG. 21B. Further, the backside source contact 282 is self-aligned to the source feature 260 as a result of the self-aligned etching processes discussed above with reference to FIG. 20D. Therefore, it is isolated from the nearby gate stacks 240' by the dielectric layers 274 and 276 as shown in FIG. 21B. The self-aligned backside contact 282 minimizes the risks of short circuit between the source feature 260 and the nearby gate stacks 240'.

In some embodiments, the process of forming the backside source silicide feature 280 is similar to that for the frontside source silicide feature 273, and the process of forming the backside source contact 282 is similar to that for the frontside source contact 275. In an embodiment, the operation 142 includes depositing one or more metals into the hole 278, performing an annealing process to the device 200 to cause reaction between the one or more metals and the source feature 260 to produce the silicide feature 280, and removing un-reacted portions of the one or more metals, leaving the silicide features 280 in the hole 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the source contact 282 may include a conductive barrier layer and a metal fill layer over the conductive barrier layer. The conductive barrier layer functions to prevent metal materials of the metal fill layer from diffusing into the dielectric layers adjacent the source contacts 282, such as the layers 230, and 274. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes. In some embodiments, the conductive barrier layer is omitted in the source contact 282. The operation 142 may perform a CMP process to remove excessive materials of the source contact 282. As shown in FIGS. 21C and 21E, the gate stacks 240' and the drain features 260 are protected from the various deposition and etching processes in the operation 142.

At operation 144, the method 100 (FIG. 1C) forms backside power rails 284 and a backside interconnect 286. The resultant structure is shown in FIGS. 22A-22B according to an embodiment. FIG. 22A illustrates a top view of the device 200, and FIG. 22B illustrates a cross-sectional view of the device 200, in portion, along the B-B line in FIG. 22A. As illustrated in FIG. 22B, the backside source contact 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 22B, the backside power rails 284 are embedded in one or more dielectric layers, and the backside interconnect 286 includes wires and vias embedded in one or more dielectric layers. In some embodiment, the backside power rails 284 are considered part of the backside interconnect 286. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

At operation 146, the method 100 (FIG. 1C) performs further fabrication processes to the device 200. For example, it may form passivation layers on the backside of the device 200, remove the carrier 370, and perform other BEOL processes.

In the above embodiments, the source feature 260 is formed with both frontside and backside silicide features and with frontside and backside contacts, while the drain feature 260 is formed with a frontside silicide feature and a frontside contact and is isolated from backside power rails. In an alternative embodiment, the drain feature 260 may be formed with both frontside and backside silicide features and with frontside and backside contacts, while the source feature 260 is formed with a frontside silicide feature and a frontside contact and is isolated from backside power rails. This may be achieved by switching the processes that are specifically applied to the source region with those that are specifically applied to the drain region in the above embodiment. For example, the semiconductor layer 239 may be provided in the drain region, but not in the source region. In another alternative embodiment, both the source feature 260 and the drain feature 260 may be formed with both frontside and backside silicide features and with frontside and backside contacts. This may be achieved by applying the processes that are specifically applied to the source region in the above embodiment to both the source region and the drain region. For example, the semiconductor layer 239 may be provided in both the source region and the drain region.

Although not intended to be limiting, embodiments of the present disclosure provide one or more of the following advantages. For example, embodiments of the present disclosure form silicide features that fully wrap around a source feature, which advantageously reduces source resistance. Also, embodiments of the present disclosure form backside source contact using a self-aligned process, which minimize the risks of the shorting the source feature to nearby conductors including the gate stacks. Embodiments of the present disclosure can be readily integrated into existing semiconductor manufacturing processes.

In one example aspect, the present disclosure is directed to a semiconductor structure that includes a source feature; a drain feature; one or more channel layers connecting the source feature and the drain feature; a gate structure between the source feature and the drain feature, the gate structure engaging each of the one or more channel layers; a first source silicide feature over the source feature; a source contact over the first source silicide feature; a second source silicide feature under the source feature; a via under the second source silicide feature; and a power rail under the via, wherein the first and the second source silicide features fully surround the source feature in a cross-sectional view.

In an embodiment, the semiconductor structure further includes a drain silicide feature over the drain feature; a drain contact over the drain silicide feature; a first dielectric feature under the drain feature and extending from the drain feature to the power rail; a first dielectric layer on a sidewall of the drain feature; and an air gap that exposes multiple sides of the first dielectric layer.

In some embodiments of the semiconductor structure, the second source silicide feature is also disposed on a sidewall of the source feature and connects with the first source silicide feature. In some embodiments, the semiconductor structure further includes a first interconnect structure over the source contact. In a further embodiment, the semiconductor structure further a second interconnect structure under the power rail.

In an embodiment, the semiconductor structure further includes a first dielectric feature under the gate structure and extending from the gate structure to the power rail. In some embodiments of the semiconductor structure, the via includes one of Cu, Al, Co, W, Ti, Ta, Mo, and Ru. In some embodiments, the power rail includes one of Cu, Al, Co, W, Ti, Ta, Mo, and Ru.

In another example aspect, the present disclosure is directed to a semiconductor structure that includes a power rail on a back side of the semiconductor structure; a first interconnect structure on a front side of the semiconductor structure; a source feature, a drain feature, multiple channel layers, and a gate structure that are between the power rail and the first interconnect structure, wherein the multiple channel layers connect the source feature and the drain feature, and the gate structure wraps around each of the channel layers; a first source silicide feature disposed on a back side of the source feature and between the source feature and the power rail, wherein the first source silicide feature is also disposed on sidewalls of the source feature that extend from the back side of the source feature towards the front side of the semiconductor structure; and a first via connecting the first source silicide feature and the power rail.

In an embodiment, the semiconductor structure further includes a second source silicide feature disposed on a front side of the source feature and connecting to the first source silicide feature; and a source contact disposed on the second source silicide feature and connecting the second source silicide feature to the first interconnect structure.

In another embodiment, the semiconductor structure further includes a first dielectric feature between the drain feature and the power rail and isolating the drain feature from the power rail. In a further embodiment, the semiconductor structure further includes a first dielectric layer on sidewalls of the drain feature and an air gap that exposes multiple surfaces of the first dielectric layer. In a further embodiment, the semiconductor structure further includes a drain silicide feature disposed on a front side of the drain feature and a drain contact disposed on the drain silicide feature.

In some embodiments, the semiconductor structure further includes a second interconnect structure on the back side of the semiconductor structure, wherein the power rail is connected to the second interconnect structure.

In yet another example aspect, the present disclosure is directed to a method that includes providing a structure having a substrate, a stack of first semiconductor layers and second semiconductor layers that are alternately stacked layer by layer over the substrate, a sacrificial gate structure disposed over a channel region of the stack, and gate spacers on opposing sidewalls of the sacrificial gate structure. The method further includes etching the stack adjacent the gate spacers to form a source trench and a drain trench on both sides of the sacrificial gate structure; epitaxially growing a source feature in the source trench and a drain feature in the drain trench; forming a first dielectric layer on side surfaces of the source feature, side surfaces of the drain feature, side surfaces of the source trench, and side surfaces of the drain trench; and forming a contact etch stop layer (CESL) over the first dielectric layer, the source feature, and the drain feature, wherein a first air gap is sealed between the CESL and the first dielectric layer in the source trench and a second air gap is sealed between the CESL and the first dielectric layer in the drain trench.

In an embodiment, the method further includes replacing the sacrificial gate structure with a high-k metal gate. In a further embodiment, the method further includes forming a first source silicide feature over the source feature and the CESL; forming a drain silicide feature over the drain feature and the CESL; forming a source contact over the first source silicide feature; and forming a drain contact over the drain silicide feature. In a further embodiment, the method further includes bonding a front side of the structure to a carrier wafer, wherein the substrate is on a back side of the structure; thinning the structure from the back side of the structure until a silicon layer of the substrate is exposed, wherein the silicon layer is disposed over a back side of the high-k metal gate and the drain feature; and replacing the silicon layer with one or more dielectric features.

In some embodiments where the thinning of the structure also exposes a silicon germanium feature that is disposed over the source feature, the method further includes removing the silicon germanium feature to expose a back side of the source feature and the first dielectric layer on the side surfaces of the source feature; removing the first dielectric layer on the side surfaces of the source feature, thereby exposing the side surfaces of the source feature; and forming a second source silicide feature on the back side of the source feature and on the side surfaces of the source feature. In a further embodiment, the method further includes forming a via on the second source silicide feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source/drain;
   one or more channel layers connected to the source/drain;
   a gate structure adjacent the source/drain and engaging each of the one or more channel layers;
   a first silicide layer over the source/drain;
   a source/drain contact over the first silicide layer;
   a power rail under the source/drain;
   one or more first dielectric layers between the source/drain and the power rail; and
   one or more second dielectric layers under the first silicide layer and on sidewalls of the source/drain, wherein the one or more second dielectric layers enclose an air gap.

2. The semiconductor structure of claim 1, wherein the one or more second dielectric layers are vertically between the first silicide layer and the one or more first dielectric layers.

3. The semiconductor structure of claim 1, wherein the one or more second dielectric layers include a top dielectric layer disposed on a bottom dielectric layer, wherein the bottom dielectric layer includes alumina, silicon nitride, silicon carbonitride, or silicon oxycarbonitride.

4. The semiconductor structure of claim 3, wherein the bottom dielectric layer has a thickness in a range from about 0.2 nm to about 4 nm.

5. The semiconductor structure of claim 1, further comprising a third dielectric layer on both sides of the source/drain, wherein the one or more second dielectric layers and the air gap are between the third dielectric layer and the source/drain.

6. The semiconductor structure of claim 5, wherein the third dielectric layer and the one or more second dielectric layers comprise different materials for etching selectivity.

7. The semiconductor structure of claim 1, wherein the source/drain is a first source/drain, further comprising:
   a second source/drain, wherein the one or more channel layers connecting to both the first source/drain and the second source/drain;
   a second silicide layer over the second source/drain; and
   a third silicide layer below the second source/drain.

8. The semiconductor structure of claim 7, wherein the second silicide layer is in contact with the third silicide layer.

9. A semiconductor structure, comprising:
   a power rail on a back side of the semiconductor structure;
   a first interconnect structure on a front side of the semiconductor structure;
   first and second source/drain layers, one or more channel layers, and a gate structure between the power rail and the first interconnect structure, wherein the one or more channel layers connect the first and second source/drain layers, and the gate structure engages each of the one or more channel layers;

a first silicide layer disposed on a front side of the first source/drain layer;

one or more first dielectric layers vertically between the first source/drain layer and the power rail; and an air gap adjacent to sidewalls of the first source/drain layer and between the first silicide layer and the one or more first dielectric layers in a cross-sectional view.

10. The semiconductor structure of claim 9, further comprising:

one or more second dielectric layers on the sidewalls of the first source/drain layer, wherein the air gap is enclosed by the one or more second dielectric layers.

11. The semiconductor structure of claim 10, wherein the one or more second dielectric layers include a top dielectric layer disposed on a bottom dielectric layer, wherein the bottom dielectric layer has a thickness from about 0.2 nm to about 4 nm.

12. The semiconductor structure of claim 11, wherein the bottom dielectric layer includes alumina, silicon nitride, silicon carbonitride, or silicon oxycarbonitride.

13. The semiconductor structure of claim 11, further comprising:

a third dielectric layer on both sides of the first source/drain layer, wherein the bottom dielectric layer is between the third dielectric layer and the first source/drain layer, wherein the third dielectric layer and the bottom dielectric layer comprise different materials for etching selectivity.

14. The semiconductor structure of claim 9, further comprising:

a second silicide layer over the second source/drain layer; and a third silicide layer below the second source/drain layer.

15. The semiconductor structure of claim 14, wherein the second and the third silicide layers wrap around the second source/drain layer in a cross-sectional view.

16. A method comprising:

providing a structure having a substrate, one or more semiconductor layers over the substrate, a sacrificial gate structure disposed over a channel region of the one or more semiconductor layers, and gate spacers on opposing sidewalls of the sacrificial gate structure;

etching the one or more semiconductor layers adjacent the gate spacers to form a source/drain trench;

epitaxially growing a source/drain layer in the source/drain trench, wherein the source/drain layer does not fully fill the source/drain trench such that side surfaces of the source/drain layer are spaced away from side surfaces of the source/drain trench;

forming a first dielectric layer on the side surfaces of the source/drain layer and the side surfaces of the source/drain trench;

replacing the sacrificial gate structure with a high-k metal gate;

forming a first silicide layer on a frontside of the source/drain layer;

thinning down the substrate from a backside of the substrate;

etching from the backside of the substrate to expose the source/drain layer;

etching the first dielectric layer from the backside of the substrate; and forming a second silicide layer on a backside of the source/drain layer.

17. The method of claim 16, wherein the etching of the first dielectric layer from the backside of the substrate exposes the first silicide layer from the backside of the source/drain layer.

18. The method of claim 16, wherein the first and the second silicide layers wrap around the source/drain layer in a cross-sectional view.

19. The method of claim 16, further comprising:

forming a contact structure in contact with the second silicide layer.

20. The method of claim 19, further comprising:

forming a metal track in contact with the contact structure.

* * * * *